United States Patent
Pyo et al.

(10) Patent No.: US 11,551,612 B2
(45) Date of Patent: Jan. 10, 2023

(54) DISPLAY DEVICE AND DISPLAY APPARATUS HAVING DISPLAY DEVICES

(71) Applicant: Samsung Display Co., LTD., Yongin-si (KR)

(72) Inventors: Ki Hyun Pyo, Seoul (KR); Bon-Yong Koo, Hwaseong-si (KR); Ji-Sun Kim, Seoul (KR); Hyeong Seok Kim, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/526,483

(22) Filed: Nov. 15, 2021

(65) Prior Publication Data

US 2022/0189399 A1 Jun. 16, 2022

(30) Foreign Application Priority Data

Dec. 11, 2020 (KR) .......................... 10-2020-0173392

(51) Int. Cl.
*G09G 3/3233* (2016.01)

(52) U.S. Cl.
CPC ..... *G09G 3/3233* (2013.01); *G09G 2300/026* (2013.01); *G09G 2300/0413* (2013.01); *G09G 2300/0842* (2013.01)

(58) Field of Classification Search
None
See application file for complete search history.

(56) References Cited

U.S. PATENT DOCUMENTS

2015/0102312 A1* 4/2015 Lee ..................... H01L 27/3223
257/40

FOREIGN PATENT DOCUMENTS

| KR | 10-2009-0048742 | 5/2009 |
| KR | 10-2018-0013531 | 2/2018 |
| KR | 10-1895217 | 9/2018 |

* cited by examiner

*Primary Examiner* — Aneeta Yodichkas
(74) *Attorney, Agent, or Firm* — Kile Park Reed & Houtteman PLLC

(57) ABSTRACT

A display device includes a first pixel circuit, a first scan signal line disposed at a side of the first pixel circuit, extending in a first direction, and transmitting a scan signal; a second pixel circuit disposed at an outermost side of the display device, and a first dummy wire disposed at an outside of the second pixel circuit and extending in the first direction. A width of the first dummy wire is less than a width of the first scan signal line.

20 Claims, 15 Drawing Sheets

DISPLAY DEVICE AND DISPLAY APPARATUS HAVING DISPLAY DEVICES

CROSS-REFERENCE TO RELATED APPLICATION(S)

This application claims priority to and the benefits of Korean Patent Application No. 10-2020-0173392 under 35 U.S.C. § 119, filed on Dec. 11, 2020 in the Korean Intellectual Property Office, the entire contents of which are incorporated herein by reference.

BACKGROUND

1. Technical Field

The disclosure relates to a display device and a display apparatus including multiple display devices, and particularly relates to a display device for forming a relatively large size display device by attaching multiple display devices.

2. Description of the Related Art

A display device represents a device for displaying images on a screen, and it may be a liquid crystal display (LCD), an organic light emitting diode display (OLED), or a quantum dot display. A display device may be used for or equipped with various electronic devices such as portable phones, GPSs, digital cameras, electronic books, portable game devices, or various terminals.

A light emitting display device includes a light emitting device such as an organic light emitting device. The light emitting display device has a self-luminance characteristic, and does not require a separate light source, unlike the LCD. Owing to such characteristics, a thickness and a weight of a light emitting display device may be less than other types of display devices. Further, the light emitting display device has high-grade characteristics such as low power consumption, high luminance, and a high response speed.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

The disclosure provides a light emitting display device that maintains a constant gap between pixels when multiple display devices are attached to create a large display device is formed by an attachment, and a large display device thereof.

In an embodiment, a display device may include a first pixel circuit, a first scan signal line disposed at a side of the first pixel circuit, extending in a first direction, and transmitting a scan signal; a second pixel circuit disposed at an outermost side of the display device, and a first dummy wire disposed at an outside of the second pixel circuit and extending in the first direction. A width of the first dummy wire may be less than a width of the first scan signal line.

The display device may include a plurality of sub-regions, and each of the plurality of sub-regions may include a scan signal applied region for transmitting the scan signal in the first direction, and a dummy region in which dummy wires are disposed. The dummy wires may include the first dummy wire.

A voltage signal for turning off a transistor may be applied to the dummy wires.

The dummy wires may further include a second dummy wire, and a width of the second dummy wire may be greater than the width of the first dummy wire.

The second dummy wire may be disposed at a side of the second pixel circuit where the first dummy wire is not disposed.

The display device may further include a third pixel circuit between the first pixel circuit and the second pixel circuit. The second dummy wire may be disposed at a side of the third pixel circuit.

The display device may further include a second scan signal line extending in a direction perpendicular to the first direction and transmitting the scan signal. The second scan signal line may be electrically connected to the first scan signal line.

The plurality of sub-regions may be provided as three sub-regions. Each of the three sub-regions may include the first scan signal line. The second scan signal line may extend in the three sub-regions. The second scan signal line may be electrically connected to the first scan signal line in each of the three sub-regions. The first scan signal line may transmit a scan signal with a same timing.

The second scan signal line may be electrically connected to a gate electrode of a thin film transistor included in the first pixel circuit and a gate electrode of a thin film transistor included in the second pixel circuit.

The first pixel circuit and the second pixel circuit may each include a driving transistor that generates an output current to a light emitting diode, an input transistor that transmits a data voltage to a gate electrode of the driving transistor, a storage capacitor having a terminal connected to the gate electrode of the driving transistor, and an initialization transistor that initializes a terminal outputting the output current from the driving transistor.

In an embodiment, a display device may comprise a plurality of display panels attached to each other. At least one of the plurality of display panels may include a first pixel circuit, a first scan signal line disposed at a side of the first pixel circuit and extending in a first direction, a second pixel circuit disposed at an outermost side of the at least one display panel, and an outermost dummy wire disposed at an outside of the second pixel circuit and extending in the first direction. A width of the outermost dummy wire may be less than a width of the first scan signal line.

The at least one display panel may include sub-regions, and each of the sub-regions may include a scan signal applied region for transmitting a scan signal in the first direction, and a dummy region in which dummy wires are disposed, the dummy wires including the outermost dummy wire is disposed.

A voltage signal for turning off a transistor may be applied to the dummy wires.

The dummy wires may further include a second dummy wire, and a width of the second dummy wire may be greater than a width of the first dummy wire.

The second dummy wire may be disposed at a side of the second pixel circuit where the first dummy wire is not disposed.

The display device may further include a third pixel circuit disposed between the first pixel circuit and the second pixel circuit. The second dummy wire may be disposed at a side of the third pixel circuit.

The display device may include a second scan signal line extending in a direction perpendicular to the first direction and transmitting the scan signal. The second scan signal line may be electrically connected to the first scan signal line.

The sub-regions may be provided as three sub-regions. Each of the sub-regions may include the first scan signal line. The second scan signal line may extend in the three sub-regions. The second scan signal line may be electrically connected to the first scan signal line in each of the three sub-regions, and the first scan signal line may transmit a scan signal with a same timing.

The second scan signal line may be electrically connected to a gate electrode of a thin film transistor included in the first pixel circuit and to a gate electrode of a thin film transistor included in the second pixel circuit.

In an embodiment, a display device may include a first pixel circuit, a pair of first scan signal lines disposed at sides of the first pixel circuit, extending in a first direction, and transmitting a scan signal, a second pixel circuit disposed at an outermost side of the display device, and a dummy wire disposed at a position corresponding to the first scan signal line inside the second pixel circuit. No wire may be disposed at a position corresponding to the first scan signal line outside the second pixel circuit.

According to the embodiments, when the tolerance or the margin for manufacturing a large display device in the case of a process such as laser beam cutting is considered by allowing the gap between the outermost pixel or the wire and the edge of the substrate to be equal to or greater than about 50 μm in the light emitting display device, the gaps of the pixels of the completed large display device may correspond to each other, and displaying quality of the large display device may be improved.

According to the embodiments, reducing the width of the wire to adjust the width of the outermost region does not cause problems due to electrical loads when the reduced wire is used as a dummy wire or the Off voltage (Voff) is applied to the reduced width wire, and thus, display quality is not deteriorated.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
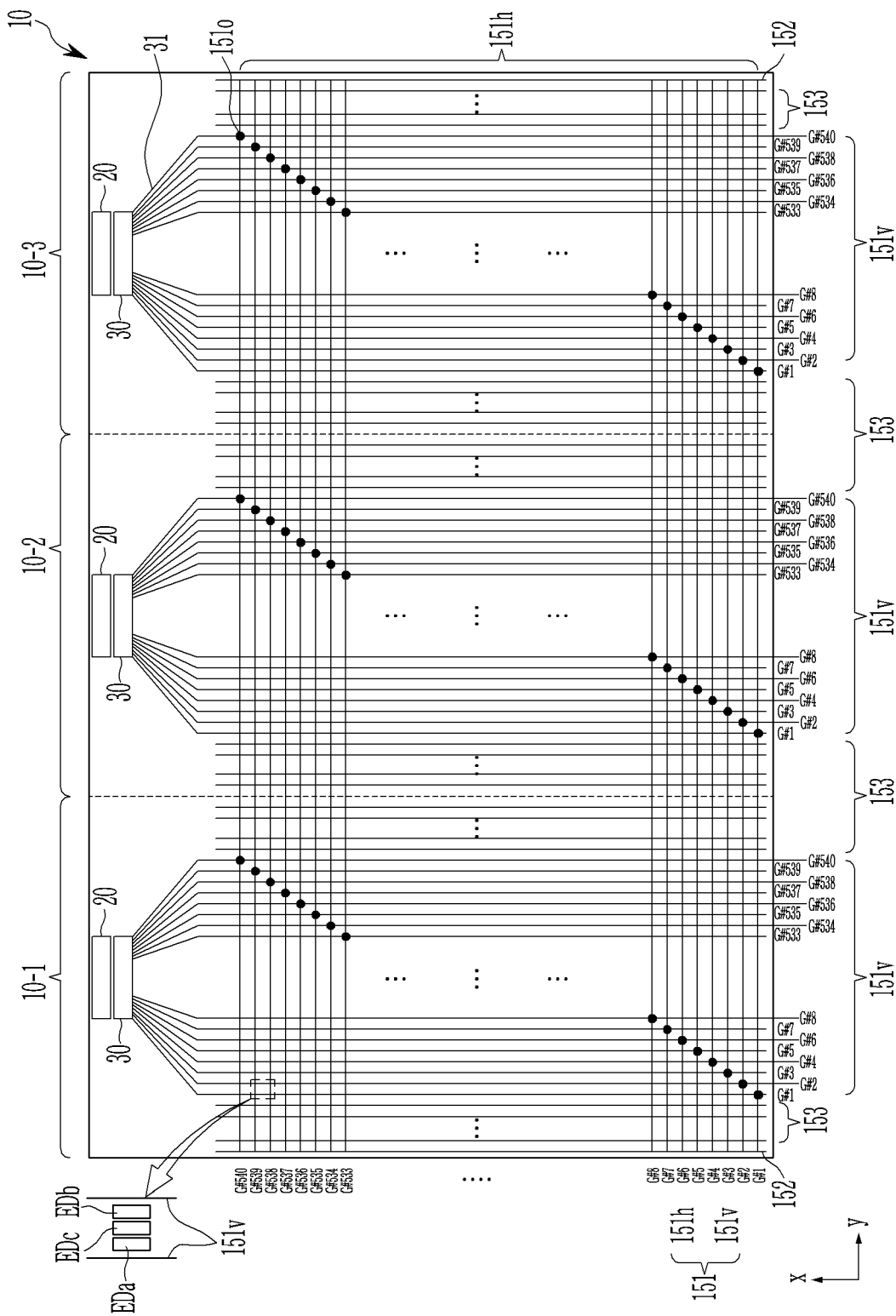
FIG. 1 shows a schematic layout view of a light emitting display device according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In the drawings, sizes, thicknesses, ratios, and dimensions of the elements may be exaggerated for ease of description and for clarity. Like numbers refer to like elements throughout.

The size and thickness of each configuration shown in the drawings are arbitrarily shown for better understanding and ease of description, but the disclosure is not limited thereto. In the drawings, the thicknesses of layers, films, panels, regions, etc., are exaggerated for clarity. The thicknesses of some layers and areas are exaggerated for convenience of explanation.

It will be understood that when an element such as a layer, film, region, or substrate is referred to as being "on" another element, it can be directly on the other element or intervening elements may also be present. In contrast, when an element is referred to as being "directly on" another element, there are no intervening elements present. The word "on" or "above" means positioned on or below the object portion, and does not necessarily mean positioned on the upper side of the object portion based on a gravitational direction.

Unless explicitly described to the contrary, the word "comprise" and variations such as "comprises" or "comprising" will be understood to imply the inclusion of stated elements but not the exclusion of any other elements.

The phrase "in a plan view" means viewing an object portion from the top, and the phrase "in a cross-sectional view" means viewing a cross-section of which the object portion is vertically cut from the side.

Throughout the specification, when it is described that a part is "connected (in contact with, coupled)" to another part, the part may be directly connected to the other element, may be connected to the other part through a third part, or may be connected to the other part physically or electrically, and they may be referred to by different titles depending on positions or functions, but respective portions that are substantially integrated into one body may be connected to each other.

It will be understood that the terms "connected to" or "coupled to" may include a physical or electrical connection or coupling.

In the specification and the claims, the phrase "at least one of" is intended to include the meaning of "at least one selected from the group of" for the purpose of its meaning and interpretation. For example, "at least one of A and B" may be understood to mean "A, B, or A and B."

It will be understood that, although the terms first, second, etc., may be used herein to describe various elements, these elements should not be limited by these terms. These terms are only used to distinguish one element from another element. For example, a first element may be referred to as a second element, and similarly, a second element may be referred to as a first element without departing from the scope of the disclosure.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within +30%, 20%, 10%, 5% of the stated value.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

An embodiment of a light emitting display device will now be described with reference to accompanying drawings.

A schematic structure of a light emitting display device will first be described with reference to FIG. 1.

FIG. 1 shows a schematic layout view of a light emitting display device according to an embodiment.

The light emitting display device 10 according to an embodiment of FIG. 1 includes a display area in which light emitting diodes (EDa, EDb, and EDc) are disposed, and a driving area which is disposed on an upper side of the display area and in which driving chips 20 and 30 are disposed.

In the display area, multiple groups of light emitting diodes (including EDa, EDb, and EDc) for expressing three primary colors such as red, green, and blue may be provided. The group of light emitting diodes (EDa, EDb, and EDc) according to an embodiment described with reference to FIG. 1 may have a configuration in which the respective light emitting diodes (LEDs) positioned lengthwise in the x-axis direction are arranged in parallel to each other in the x-axis direction. However, the embodiments are not limited thereto and the light emitting diodes (LED) belonging to the group of light emitting diodes (EDa, EDb, and EDc) may have a differing number or arrangement from what is described with reference to FIG. 1.

A light emitting display device 10 according to an embodiment described with reference to FIG. 1 may be divided into three sub-regions 10-1, 10-2, 10-3, and the respective sub-regions are distinguished and illustrated with dotted lines. The respective sub-regions may include a display area in which light emitting diodes (EDa, EDb, and EDc) are disposed, and a driving area on an upper side of the display area and in which driving chips 20 and 30 are disposed. Regarding the light emitting display device 10 according to an embodiment described with reference to FIG. 1, the driving area is disposed on the upper side and is not disposed on the right side, the left side, or the lower side. As a result, other light emitting display devices 10 may be attached to the right, left, and lower sides to form a large display device (refer to FIG. 10). The driving area disposed in the light emitting display device may only be disposed on one side of the display area.

A sub-region corresponds to a data driver 20 and a scan driver 30 and may be configured with a group of light emitting diodes (EDa, EDb, and EDc) that emit light when a data voltage is applied by the data driver 20.

The data driver 20 applies data voltages to data lines (refer to FIG. 2 and FIG. 3), and it may be disposed in a chip mounted on the substrate. Although not shown in FIG. 1, the data driver 20 applies the data voltage to the respective data lines electrically connected to the data line extending in the x-axis direction.

The scan driver 30 applies a scan signal to the scan signal line 151, and it may be mounted on the substrate as a chip. FIG. 1 illustrates a detailed connection structure of the scan signal line 151. The scan signal line 151 generally includes a connecting scan signal line (151*v*; a first scan signal line) and a main scan signal line (151*h*; a second scan signal line), and the main scan signal line 151*h* extends in the y-axis direction, while the connecting scan signal line 151*v* generally extends in the x-axis direction. The connecting scan signal line 151*v* is electrically connected to the scan driver 30 to receive a scan signal. Depending on an embodiment, an additional connecting member may be disposed to connect the connecting scan signal line 151*v* and the scan driver 30.

The main scan signal line 151*h* is electrically connected to the connecting scan signal line 151*v* through an opening 151*o*. As a result, the scan signal output by the scan driver 30 is transmitted to the connecting scan signal line 151*v* and is transmitted to the main scan signal line 151*h* through the opening 151*o*. The connecting scan signal line 151*v* is disposed in one sub-region and does not extend to the adjacent sub-region. In contrast, the main scan signal line 151*h* extends to the adjacent sub-region and is sequentially provided in three sub-regions. One connecting scan signal line 151ν is electrically connected to a main scan signal line 151h through the opening 151o in a sub-region. However, regarding the light emitting display device 10 including three sub-regions, one main scan signal line 151h is electrically connected to three connecting scan signal lines 151ν respectively through one opening 151o. As a result, one main scan signal line 151h receives three scan signals having the same timing. For example, in FIG. 1, the scan signal line 151 marked as a first scan signal line G #1 includes a total of three connecting scan signal lines 151ν for each sub-region and a main scan signal line 151h. The scan signal lines 151 with the same number are electrically connected to each other and receive the same scan signal.

Figure 3:
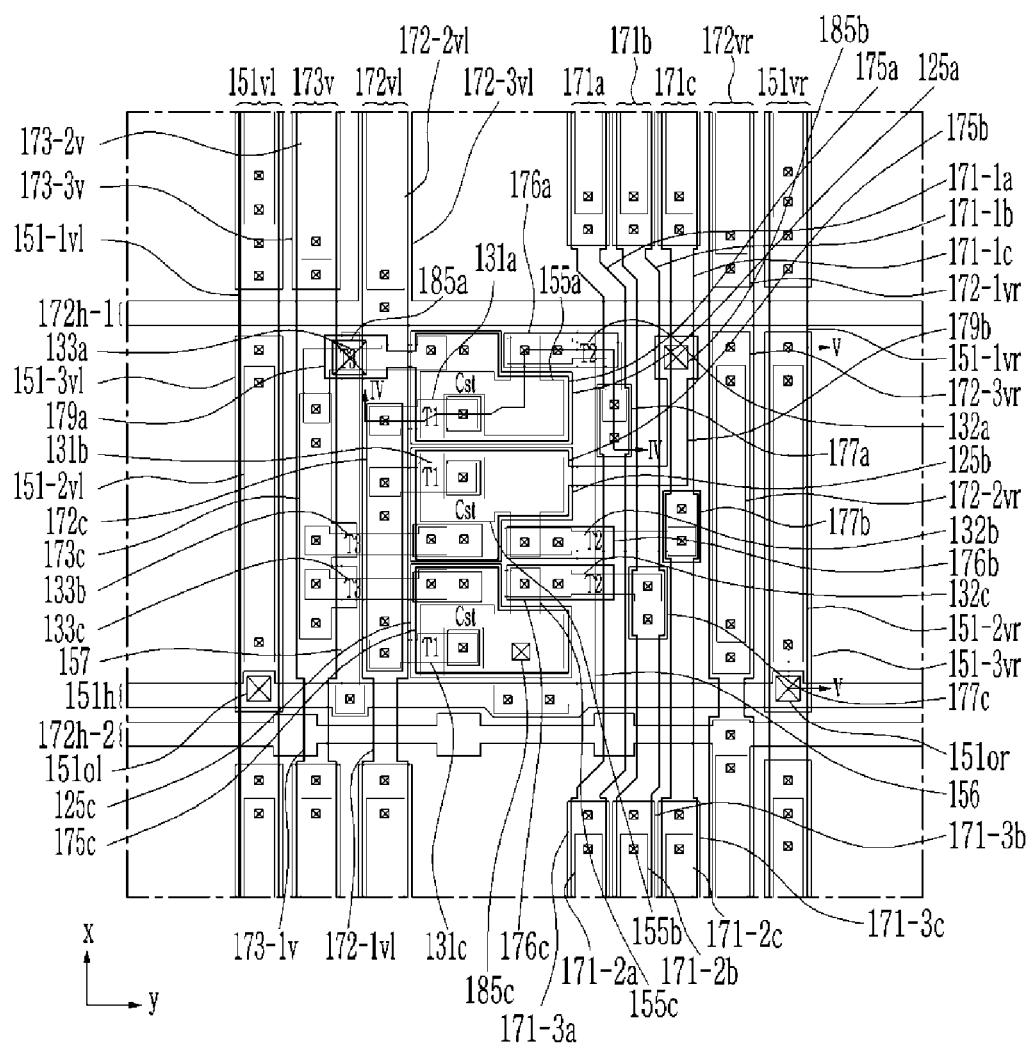
FIG. 3 shows a schematic top plan view of a pixel disposed in a scan signal applied region of a light emitting display device according to an embodiment.

Generally, in display devices the data driver and the scan driver are disposed on different sides of the display area to have a direction perpendicular to the main scan signal line 151h, and there is no need for connecting scan signal lines 151ν to connect the scan driver. However, in the embodiment, the driving area (with both the data driver and scan driver) may be disposed on one side of the display area, so as illustrated in FIG. 3, the connecting scan signal line 151ν, provided in parallel to the data line, transmits the scan signal to the main scan signal line 151h perpendicularly disposed to the data line.

The light emitting display device 10 may further includes wires 152 and 153 (dummy wires hereinafter) disposed in parallel to the connecting scan signal line 151ν and extending in the x-axis direction. A constant voltage level, an Off voltage (Voff) for maintaining the transistor in a turn-off state from the scan signals may be applied to the dummy wires 152 and 153. Depending on embodiments, no voltage may be applied to the dummy wires 152 and 153 so they may float, or a different voltage may be applied.

As shown in FIG. 1, the dummy wires 152 and 153 may not be electrically connected to the main scan signal line 151h. As a result, the opening 151o overlapping the dummy wires 152 and 153 is not provided.

The dummy wires 152 and 153 may include two types of wires, including first dummy wires 152 (an outermost dummy wire hereinafter) with a line width that is narrower than the line width of the connecting scan signal line 151ν, and second dummy wires 153 with a same line width as the connecting scan signal line 151ν. The first dummy wires 152 may be disposed on the outermost sides (the edges) of the light emitting display device 10. A total of two first dummy wires 152 may be disposed on respective sides (the edges) of the light emitting display device 10. The other dummy wires are provided as the second dummy wire 153. Therefore, the first dummy wire 152 may not be disposed on the boundaries of the sub-regions where the second dummy wires 153 are disposed. The first dummy wires 152 may be narrower than the second dummy wires 153 or the connecting scan signal lines 151ν to form a large display device (refer to FIG. 10) by attaching multiple light emitting display devices 10 together. When attaching the light emitting display devices, a process such as laser beam cutting is performed. Thea light emitting display device 10 may be provided for attachment (the light emitting display device 10 may be attached) after the laser beam cutting process is performed, and the narrow width of the first dummy lines 152 allow adjusting the tolerance or margins so that gaps among the light emitting diodes (EDa, EDb, and EDc) may be kept constant, even between the light emitting diodes (EDa, EDb, and EDc) on different light emitting display devices 10. As a result, when the large display device is completed, the gaps among the light emitting diodes (EDa, EDb, and EDc) may be constant and uniform across the large display device, and the display quality of the large display device may be improved.

As illustrated in FIG. 1, many second dummy wires 153 may be provided, and the embodiments are not limited by the specific number of second dummy wires 153. The second dummy wires 153 may be the remaining wires after forming the necessary connecting scan signal lines 151ν, and excluding the two first dummy wires 152 from the remaining wires.

Referring to an enlarged portion shown in FIG. 1, and referring to FIGS. 3, 6, 7, and 8, wires (connecting wires hereinafter) extending in the x-axis direction are disposed on respective sides of the one group of light emitting diodes (EDa, EDb, and EDc), and may be used as the connecting scan signal line 151ν or the dummy wires 152 and 153. Regarding the light emitting diodes (EDa, EDb, and EDc) disposed on the outermost side, the wire is disposed on the outermost side as the first dummy wire 152, and the other is disposed as the second dummy wire 153.

For a light emitting display device 10 with a resolution of 960×540 as shown in FIG. 1, 960×540 groups of light emitting diodes (EDa, EDb, and EDc) may be needed. The number of main scan signal lines (151h) needed may be 540, and the number of data lines needed may be 960×3. To apply the scan signal to the main scan signal line 151h, some of the connecting wires are used as the connecting scan signal line 151ν, and the others are used as the dummy wires 152 and 153 according to an embodiment described with reference to FIG. 1. Each of the respective sides of the light emitting diode (EDa, EDb, and EDc) groups may have a connecting wire disposed in the x-axis direction, so double the number of the light emitting diode (EDa, EDb, and EDc) groups arranged in the y-axis direction may be needed. Thus, the total number of the connecting wires may be 960×2. The scan signal may be applied to the main scan signal line 151h by using 540 connecting wires among the 960×2 wires, and according to an embodiment in FIG. 1 with three sub-regions, the number of connecting wires are used as the connecting scan signal line 151ν is 540×3, and same scan signals as applied to the respective main scan signal lines 151h are applied to the connecting scan signal lines 151ν. It is sufficient for the number of connecting scan signal lines 151ν to be equal to or greater than the number of main scan signal lines 151h, but in the embodiments, the number of connecting scan signal lines 151ν may be various a multiple, such as two times, three times, or four times the number of main scan signal lines 151h.

Once the number of the connecting scan signal lines 151ν is determined, the remaining number of connecting wires, generated by subtracting the number of the connecting scan signal lines 151ν from the total number of connecting wires is the number of dummy wires 152 and 153. In an embodiment, as illustrated in FIG. 1, 300 connecting wires in total are used as the dummy wires 152 and 153, two of them are first dummy wires 152, while the remaining 298 are second dummy wires 153. In the embodiment, the connecting wire is disposed on the respective sides of the group of light emitting diodes (EDa, EDb, and EDc), and in other embodiments, the connecting wire may be formed only on one side of the group of light emitting diodes (EDa, EDb, and EDc).

Hereinafter, the regions where the connecting wires disposed next to the group of light emitting diodes (EDa, EDb, and EDc) are used as a connecting scan signal line 151ν will be referred to as a scan signal applied region (or a center region), and the regions where the dummy wires 152 and 153 are disposed will be referred to as a dummy region (or a side region). The scan signal applied region (or the center region) represents a region in which the scan signal is transmitted in the x-axis direction through the connecting scan signal line 151v.

A circuit configuration of pixels disposed in a light emitting display device 10 will now be described with reference to FIG. 2.

Figure 2:
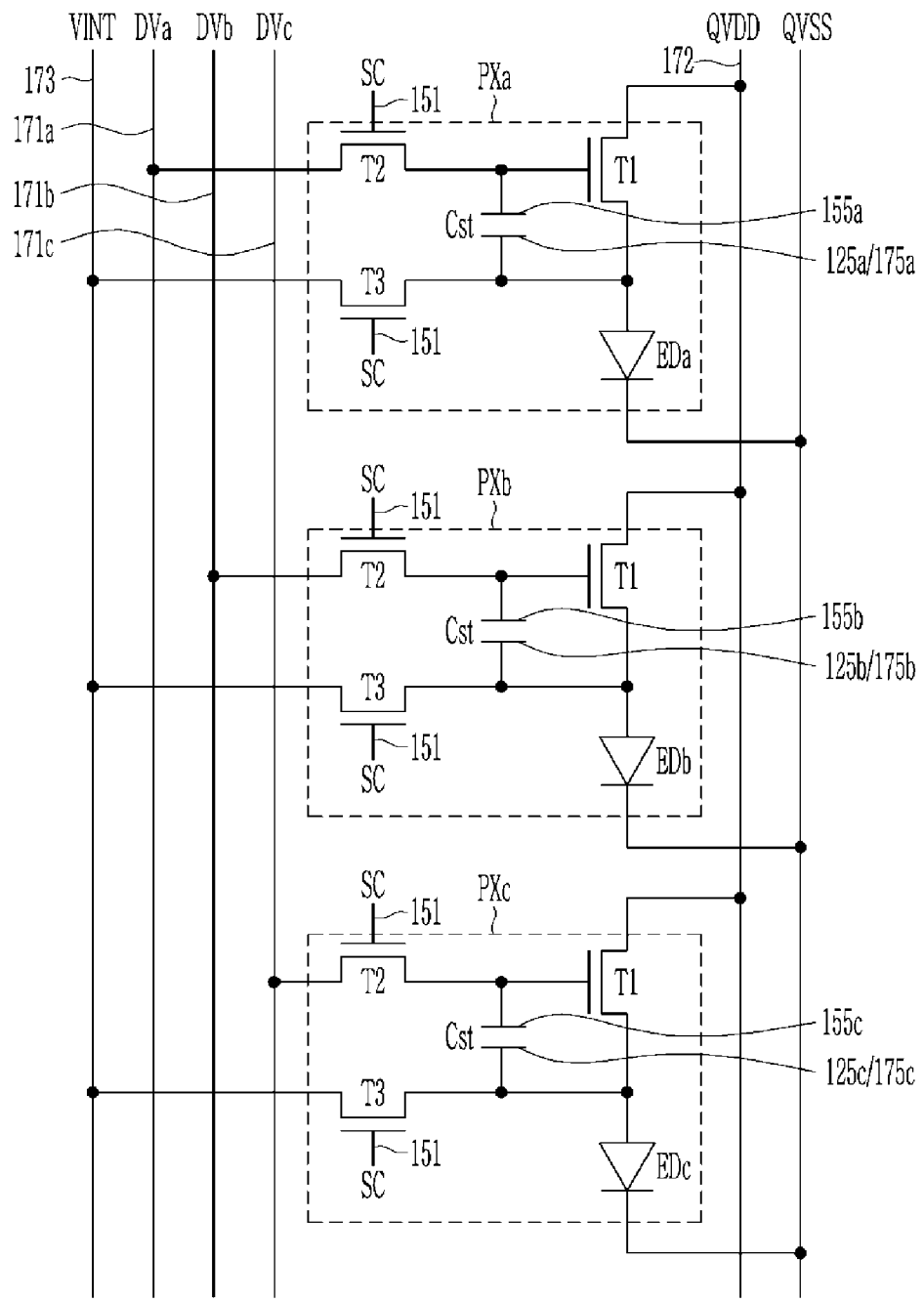
FIG. 2 shows a schematic diagram of an equivalent circuit of a pixel of a light emitting display device according to an embodiment.

FIG. 2 shows a schematic diagram of an equivalent circuit of a pixel of a light emitting display device according to an embodiment.

FIG. 2 illustrates a circuit diagram of three pixels including a group of light emitting diodes (EDa, EDb, and EDc).

As shown in FIG. 2, the pixels may include a first pixel (PXa), a second pixel (PXb), and a third pixel (PXc). The first pixel (PXa), the second pixel (PXb), and the third pixel (PXc) respectively include transistors T1, T2, and T3, a storage capacitor Cst, and light emitting diodes (EDa, EDb, and EDc) that are light-emitting devices. The pixels (PXa, PXb, and PXc) may be divided into light emitting diodes (EDa, EDb, and EDc) and a pixel circuit, and the pixel circuit may include a plurality of transistors T1, T2, and T3 and a storage capacitor Cst in FIG. 2.

The transistors T1, T2, and T3 may be configured with one driving transistor (T1; a first transistor) and two switching transistors T2 and T3, and the two switching transistors includes an input transistor (T2; a second transistor) and an initialization transistor (T3; a third transistor). The transistors T1, T2, and T3 each may include a gate electrode, a first electrode, and a second electrode, and include a semiconductor layer, so the current flows to the semiconductor layer or is intercepted according to the voltage at the gate electrode. One of the first electrode and the second electrode may be a source electrode, and the other electrode may be a drain electrode according to the voltages applied to the transistors T1, T2, and T3.

The gate electrode of the driving transistor T1 may be electrically connected to a first end of the storage capacitor Cst, and may be electrically connected to a second electrode (an electrode on an output side) of the input transistor T2. The first electrode of the driving transistor T1 may be electrically connected to the driving voltage line 172 for transmitting a driving voltage (QVDD), and the second electrode of the driving transistor T1 may be electrically connected to anodes of the light emitting diodes (EDa, EDb, and EDc), a second end of the storage capacitor Cst, and a first electrode of the third transistor T3. The driving transistor T1 may receive data voltages (DVa, DVb, and DVc) through the gate electrode according to a switching operation of the input transistor T2 and may supply a driving current to the light emitting diodes (EDa, EDb, and EDc) according to the voltage at the gate electrode. The storage capacitor Cst stores the voltage at the gate electrode of the driving transistor T1 and maintains the same.

The gate electrode of the input transistor T2 may be electrically connected to the scan signal line 151 for transmitting a scan signal (SC). Here, the scan signal line 151 illustrated to be electrically connected to the gate electrode of the input transistor T2 may be the main scan signal line 151h of FIG. 1. The first electrode of the input transistor T2 may be electrically connected to the data lines 171a, 171b, and 171c for transmitting the data voltages (DVa, DVb, and DVc), and the second electrode of the input transistor T2 may be electrically connected to the first end of the storage capacitor Cst and the gate electrode of the driving transistor T1. The data lines 171a, 171b, and 171c may transmit data voltages (DVa, DVb, and DVc which may each have different values), and the input transistors T2 of the pixels (PXa, PXb, and PXc) may be electrically connected to separate data lines. The gate electrode of the input transistor T2 of the respective pixels (PXa, PXb, and PXc) may be electrically connected to the same scan signal line 151 and may receive the scan signal (SC) with a same timing. In case that the input transistors T2 of the pixels (PXa, PXb, and PXc) are simultaneously turned on according to the scan signal (SC) with a same timing, the data voltages (DVa, DVb, and DVc) are transmitted to the gate electrode of the driving transistor T1 of the respective pixels (PXa, PXb, and PXc) and a first end of the storage capacitor Cst.

The gate electrode of the initialization transistor T3 may be electrically connected to the scan signal line 151 for transmitting the scan signal (SC). Here, the scan signal line 151 illustrated to be electrically connected to the gate electrode of the initialization transistor T3 may be the main scan signal line 151h of FIG. 1. The first electrode of the initialization transistor T3 is connected to the second end of the storage capacitor Cst, the second electrode of the driving transistor T1, and the anodes of the light emitting diodes (EDa, EDb, and EDc), and the second electrode of the initialization transistor T3 is connected to the initialization voltage line 173 for transmitting the initialization voltage (VINT). As a result, the initialization transistor T3 initializes the second electrode (a terminal for outputting an output current) of the driving transistor T1 and initializes the anodes of the light emitting diodes (EDa, EDb, and EDc) and the second end of the storage capacitor Cst.

Depending on embodiments, the initialization voltage line 173 may function as a sensing wire by sensing the voltage at the anodes of the light emitting diodes (EDa, EDb, and EDc) before applying the initialization voltage (VINT). The sensing operation may confirm whether the voltage at the anode is maintained at a target voltage. The sensing operation and the initialization operation for transmitting the initialization voltage (VINT) may be performed at different times, and the initialization operation may be performed after the sensing operation is performed.

The initialization transistor T3 may be turned on together with the input transistor T2 according to a scan signal (SC), to thus transmit the initialization voltage (VINT) to the anodes of the light emitting diodes (EDa, EDb, and EDc) and the second end of the storage capacitor Cst and initialize the voltages at the second end of the storage capacitor Cst and the anodes of the light emitting diodes (EDa, EDb, and EDc).

Figure 4:
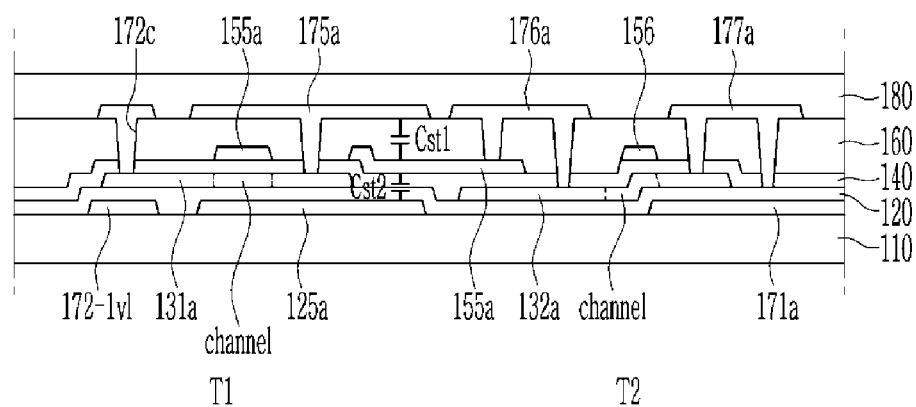
FIG. 4 and FIG. 5 show schematic cross-sectional views of a light emitting display device with respect to lines IV-IV and V-V of FIG. 3.

The first end of the storage capacitor Cst may be electrically connected to the gate electrode of the driving transistor T1 and the second electrode of the input transistor T2, and the second end is electrically connected to the first electrode of the initialization transistor T3 and the anodes of the light emitting diodes (EDa, EDb, and EDc). FIG. 2 provides reference numerals of the first end and the second end of the storage capacitor Cst to clarify which portion corresponds to the storage capacitor Cst in FIG. 3. The first end of the storage capacitor Cst corresponds to the gate electrodes 155a, 155b, and 155c of the driving transistor T1, and the second end of the storage capacitor Cst is disposed on the lower storage electrodes 125a, 125b, and 125c and the upper storage electrodes 175a, 175b, and 175c. Referring to FIG. 4, as an example for pixel PXa, illustrating a cross-sectional structure of the storage capacitor Cst, the lower storage electrode 125a is disposed below the gate electrode 155a of the driving transistor T1, with insulation between the lower storage electrode 125a and the gate electrode 155a. The upper storage electrode 175a is disposed above the gate electrode 155a with insulation. Insulating layers 120, 140, and 160 disposed between the three layers (lower storage electrode 125a, gate electrode 155a, and upper storage electrode 175a) function as dielectric layers, and the lower storage electrode 125a and the upper storage electrode 175a are electrically connected to each other. The storage capacitors Cst for the pixels PXb and PXc may include similar structures.

Cathodes of the light emitting diodes (EDa, EDb, and EDc) may receive a common voltage (QVSS), and the light emitting diodes (EDa, EDb, and EDc) may emit light according to the output current value of the driving transistor T1 to express gradations in their colors.

Depending on embodiments, an additional capacitor connected to the anodes and the cathodes of the light emitting diodes (EDa, EDb, and EDc) may be further included. The additional capacitor maintains the voltages at the respective ends of the light emitting diodes (EDa, EDb, and EDc) so that the light emitting diodes (EDa, EDb, and EDc) may output a constant luminance.

An operation of a pixel having a circuit of FIG. 2 will now be described.

FIG. 2 illustrates an embodiment in which the transistors T1, T2, and T3 are n-type transistors, and have a characteristic that they are turned on when a high-level voltage is applied to the gate electrode. However, depending on embodiments, the respective transistors T1, T2, and T3 may be p-type transistors.

Each frame may start at the end of an emission section. A high-level scan signal (SC) may be supplied, and the input transistor T2 and the initialization transistor T3 may be turned on.

As the input transistor T2 is turned on, a programming operation may be performed. The data voltages (DVa, DVb, and DVc) from the data line are input to the gate electrode of the driving transistor T1 and to the first end of the storage capacitor Cst (and stored by the capacitor Cst) through the turned-on input transistor T2.

Alternatively, the initialization operation may be performed as the initialization transistor T3 is turned on. The voltages at the second end of the storage capacitor Cst, the second electrode of the driving transistor T1, and the anodes of the light emitting diodes (EDa, EDb, and EDc) may be changed to the initialization voltage (VINT) transmitted by the initialization voltage line 173 to perform an initialization process.

The data voltages (DVa, DVb, and DVc) and the initialization voltage (VINT) are applied to the respective ends of the storage capacitor Cst. When an output current is generated from the driving transistor T1 while the initialization transistor T3 is turned on, it may be output to the outside through the initialization transistor T3 and the initialization voltage line 173, so it may not be input to the light emitting diodes (EDa, EDb, and EDc). Depending on embodiments, for the programming section for supplying a high-level scan signal (SC), the driving voltage (QVDD) may be applied as a low-level voltage, or the common voltage (QVSS) may be applied as a high-level voltage so that no current may be applied to the light emitting diodes (EDa, EDb, and EDc).

When the scan signal (SC) is changed to low-level, the normal high-level driving voltage (QVDD) and the low-level common voltage (QVSS) are applied to the pixel, so an emission section for the driving transistor T1 to generate an output current and for the output current to flow to the light emitting diodes (EDa, EDb, and EDc) and emit light is performed by the gate voltage of the driving transistor T1 stored in the storage capacitor Cst.

A detailed structure of a pixel circuit of a pixel configured as shown in FIG. 2 will now be described in relations to the light emitting display device 10 with reference to FIG. 3 to FIG. 8.

FIG. 3 to FIG. 8 show a configuration of a pixel circuit including transistors T1, T2, and T3 and a storage capacitor Cst. The anodes of the light emitting diodes (EDa, EDb, and EDc) are not shown.

A group of light emitting diodes (EDa, EDb, and EDc), as shown in FIG. 1, are arranged in parallel in the x-axis direction, and each pixel circuit is disposed in the y-axis direction. Referring to FIG. 3, a first pixel circuit belonging to a first pixel (PXa) is disposed at the top, a second pixel circuit belonging to a second pixel (PXb) is disposed below the first pixel (PXa), and a third pixel circuit belonging to a third pixel (PXc) is disposed at the bottom. The first to third pixel circuits will be referred to as a pixel circuit of a group.

Figure 5:
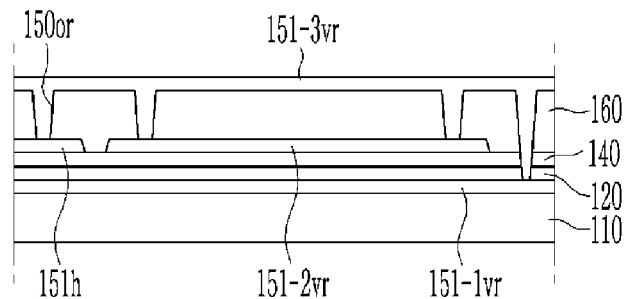
Figure 6:
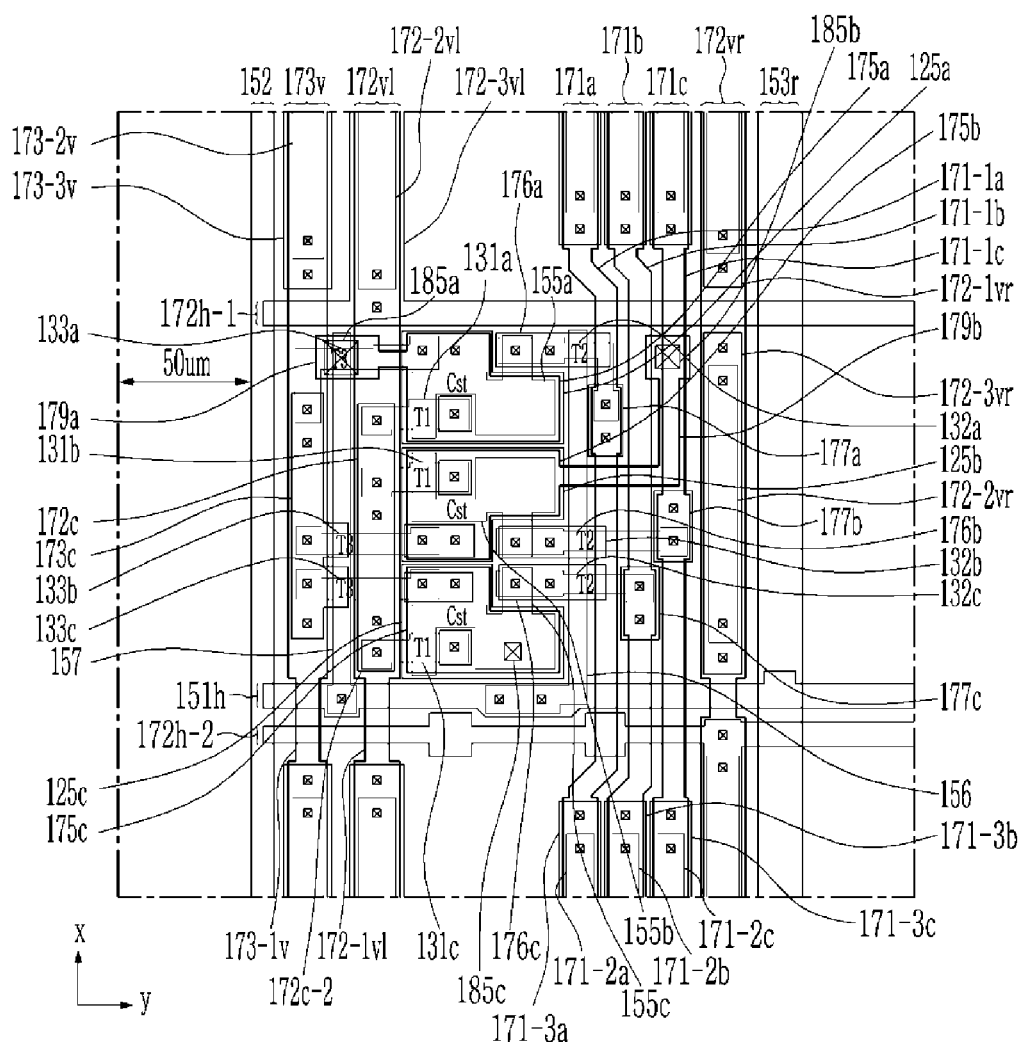
FIG. 6 shows a schematic top plan view of a pixel disposed on an outermost left side of a light emitting display device according to an embodiment.
Figure 7:
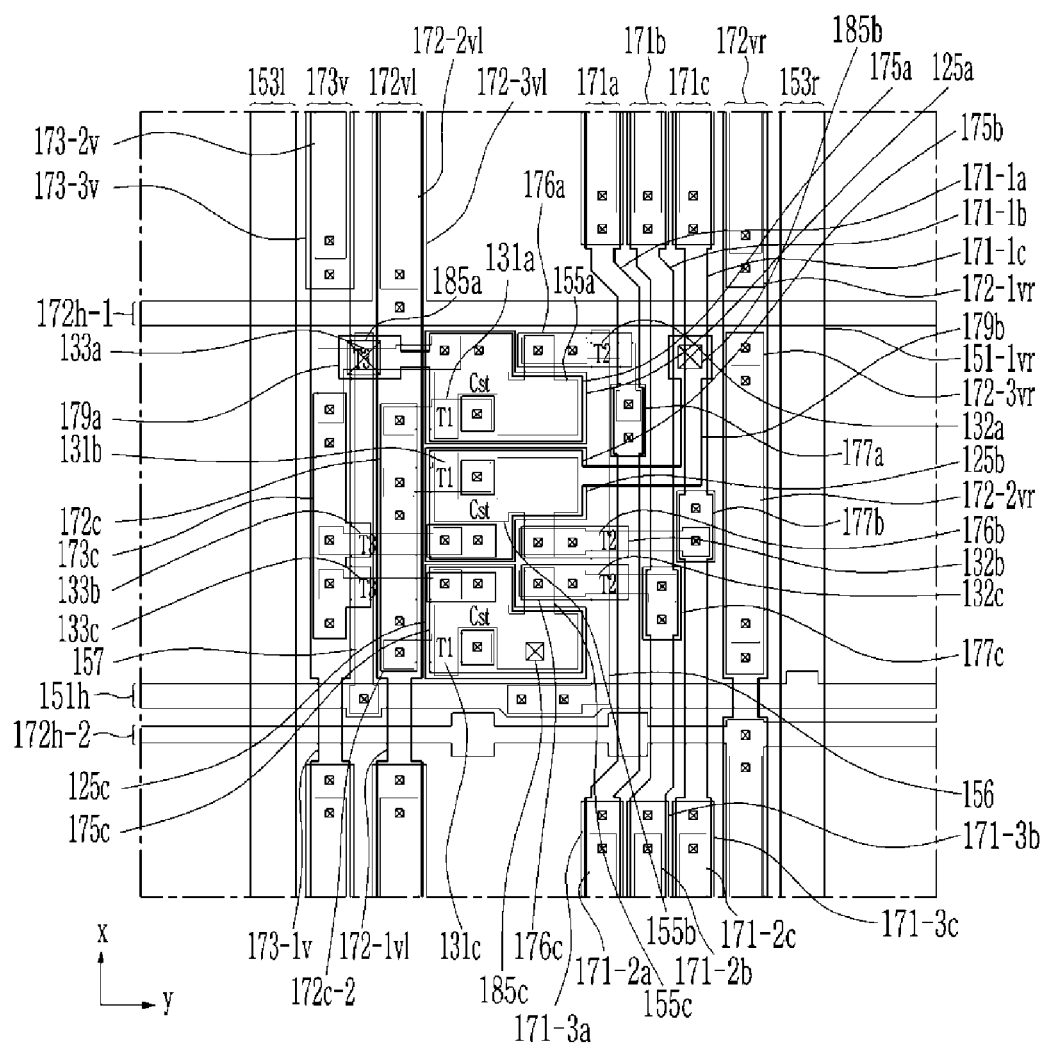
FIG. 7 shows a schematic top plan view of a pixel disposed in a voltage applied region of a light emitting display device according to an embodiment.
Figure 8:
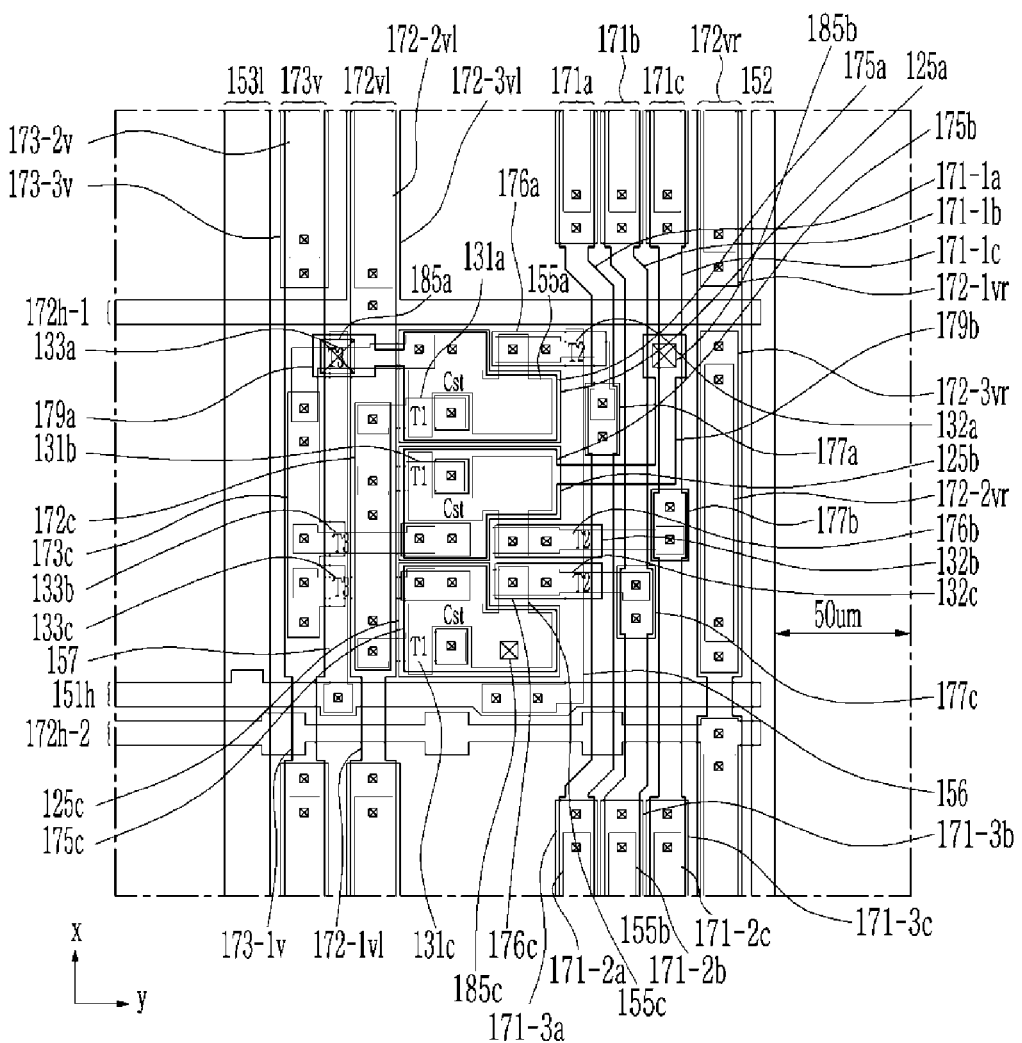
FIG. 8 shows a schematic top plan view of a pixel disposed on an outermost right side of a light emitting display device according to an embodiment.

FIG. 3 to FIG. 5 show a structure of a pixel circuit of a pixel disposed in a scan signal applied region (a center region) of a light emitting display device 10, and FIG. 6 to FIG. 8 show a structure of a pixel circuit of a pixel disposed in a dummy region (a side region).

A configuration of a pixel circuit disposed in a scan signal applied region (a center region) will now be described with reference to FIG. 3 to FIG. 5.

FIG. 3 shows a schematic top plan view of a pixel disposed in a scan signal applied region of a light emitting display device according to an embodiment, and FIG. 4 and FIG. 5 show cross-sectional views of a light emitting display device with respect to lines IV-IV and V-V of FIG. 3.

A stacked structure of a light emitting display device 10 according to an embodiment will now be described with reference to FIG. 3.

The light emitting display device may include a substrate 110. The substrate 110 may include an insulating material such as glass or plastic and may have flexibility.

A first conductive layer, a first insulating layer 120, a semiconductor layer, a second insulating layer 140, a second conductive layer, a third insulating layer 160, a third conductive layer, and a fourth insulating layer 180 are sequentially disposed on the substrate 110. The first insulating layer 120 and the second insulating layer 140 may be inorganic insulating layers including inorganic insulating materials, and the third insulating layer 160 and the fourth insulating layer 180 may be organic insulating layers including organic insulating materials. Depending on embodiments, the respective insulating layers may be made of multiple layers, and depending on embodiments, the third insulating layer 160 may be an inorganic insulating layer. The inorganic insulating material may include a silicon nitride (SiNx), a silicon oxide (SiOx), and a silicon oxynitride (SiON), and the organic insulating material may include a polyimide, an acryl-based polymer, and a siloxane-based polymer. Further, the first conductive layer, the second conductive layer, and the third conductive layer may include at least one of metals including copper (Cu), aluminum (Al), magnesium (Mg), silver (Ag), gold (Au), platinum (Pt), palladium (Pd), nickel (Ni), neodymium (Nd), iridium (Ir), molybdenum (Mo), tungsten (W), titanium (Ti), chromium (Cr), tantalum (Ta), and an alloy thereof. The first conductive layer, the second conductive layer, and the third conductive layer may respectively be made of a single layer or a multilayer. For example, they may have a multilayered structure including a lower layer having titanium and an upper layer having copper. The semiconductor layer may include a semiconductor material such as amorphous silicon, polysilicon, or an oxide semiconductor. In the embodiment, the semiconductor layer including an oxide semiconductor will be described.

The scan signal lines 151 may include a main scan signal line 151h and a connecting scan signal line 151v.

The main scan signal line 151h may extend in the y-axis direction, and may be provided for each group of pixel circuits, and may be formed on the third conductive layer as a single layer.

The connecting scan signal line 151v extends in the x-axis direction, and a pair of connecting scan signal lines 151vl and 151vr are on the left and right sides. The one pair of connecting scan signal lines 151vl and 151vr include portions with a triple-layer structure, and first connecting scan signal lines 151-1vl and 151-1vr disposed on the first conductive layer, second connecting scan signal lines 151-2vl and 151-2vr disposed on the second conductive layer, and third connecting scan signal lines 151-3vl and 151-3vr disposed on the third conductive layer are disposed. The first connecting scan signal lines 151-1vl and 151-1vr are sequentially disposed in the x-axis direction, and the second connecting scan signal lines 151-2vl and 151-2vr and the third connecting scan signal lines 151-3vl and 151-3vr extend in the x-axis direction in a predetermined region and are electrically connected to the first connecting scan signal lines 151-1vl and 151-1vr to reduce wire resistance. Referring to FIG. 5, the first connecting scan signal lines 151-1vl and 151-1vr are electrically connected to the third connecting scan signal lines 151-3vl and 151-3vr through the opening in the first insulating layer 120, the second insulating layer 140, and the third insulating layer 160, and the third connecting scan signal lines 151-3vl and 151-3vr are electrically connected to the second connecting scan signal lines 151-2vl and 151-2vr through the opening in the third insulating layer 160. In the embodiment, the first connecting scan signal lines 151-1vl and 151-1vr are not directly connected to the second connecting scan signal lines 151-2vl and 151-2vr. However, depending on embodiments, the connecting scan signal lines 151vl and 151vr may have various connection relationships, and they may have a double-layer or single-layer structure.

One of the connecting scan signal lines 151vl and 151vr is electrically connected to one main scan signal line 151h, and one main scan signal line 151h is electrically connected to three connecting scan signal lines 151vl and 151vr according to an embodiment described with reference to FIG. 1. It is electrically connected to the main scan signal line 151h through the openings 150ol and 150or on a portion in which the first connecting scan signal lines 151-1vl and 151-1vr are given on a portion in which the connecting scan signal lines 151vl and 151vr are electrically connected to the main scan signal line 151h. The openings 150ol and 150or are not limited to the portions in which the first connecting scan signal lines 151-1vl and 151-1vr are disposed, and the openings 150ol and 150or may be in the portion electrically connected to the main scan signal line 151h. FIG. 3 illustrates both openings 150ol and 150or to show their positions in the scan signal applied region (a center region). In other embodiments, only one of the two openings 150ol and 150or disposed on the respective sides may be disposed, or both of the openings 150ol and 150or may be omitted.

The main scan signal line 151h is electrically connected to the second gate electrode 156 and the third gate electrode 157 through the opening. The scan signal controls the input transistor T2 and the initialization transistor T3 included in the group of pixel circuits through the electrically connected gate electrodes 156 and 157.

The data lines 171a, 171b, and 171c extends in the x-axis direction, and three data lines 171a, 171b, and 171c are disposed on one side of the pixel circuit. The data lines 171a, 171b, and 171c may include a portion having a triple layer structure, and first data lines 171-1a, 171-1b, and 171-1c may be disposed on the first conductive layer, second data lines 171-2a, 171-2b, and 171-2c may be disposed on the second conductive layer, and third data lines 171-3a, 171-3b, and 171-3c may be disposed on the third conductive layer. The first data lines 171-1a, 171-1b, and 171-1c are sequentially disposed in the x-axis direction, and the second data lines 171-2a, 171-2b, and 171-2c and the third data lines 171-3a, 171-3b, and 171-3c extend in the x-axis direction in a region and are electrically connected to the first data lines 171-1a, 171-1b, and 171-1c to reduce wire resistance. The connection structure of three layers of the data lines 171a, 171b, and 171c may be a structure in which the first conductive layer is connected to the third conductive layer and the third conductive layer is connected to the second conductive layer, similar to the connection structure of the connecting scan signal lines 151vl and 151vr of FIG. 5. The three layers may be electrically connected to each other. The first data lines 171-1a, 171-1b, and 171-1c may be electrically connected to the third data lines 171-3a, 171-3b, and 171-3c through the opening in the first insulating layer 120, the second insulating layer 140, and the third insulating layer 160, and the third data lines 171-3a, 171-3b, and 171-3c may be electrically connected to the second data lines 171-2a, 171-2b, and 171-2c through the opening in the third insulating layer 160. In the embodiment, the first data lines 171-1a, 171-1b, and 171-1c are not directly connected to the second data lines 171-2a, 171-2b, and 171-2c but the embodiments are not limited thereto. The data lines 171a, 171b, and 171c may be connected in a variety of ways, and they may have a double-layer or single-layer structure.

Regarding the data lines 171a, 171b, and 171c, the first data lines 171-1a, 171-1b, and 171-1c are respectively electrically connected to the second semiconductors 132a, 132b, and 132c through the connecting members 177a, 177b, and 177c disposed on the third conductive layer on the portion in which the first data lines 171-1a, 171-1b, and 171-1c are disposed.

Thus, although a single scan signal line 151 is connected to three pixels (PXa, PXb, and PXc) disposed in a column, different data voltages (DVa, DVb, and DVc) may be received through the data lines 171a, 171b, and 171c. The respective light emitting diodes (EDa, EDb, and EDc) of to the respective pixels (PXa, PXb, and PXc) may output different levels of luminance.

The driving voltage line 172 for transmitting a driving voltage (QVDD) may include main driving voltage lines 172vl and 172vr and sub-driving voltage lines 172h-1 and 172h-2.

The main driving voltage lines 172vl and 172vr may extend in the x-axis direction, and a pair of main driving voltage lines 172vl and 172vr may be disposed on respective sides of the pixel circuit. The sub-driving voltage lines 172h-1 and 172h-2 may extend in the y-axis direction, and may be formed in pairs on a top and a bottom for each pixel circuit of a group. The driving voltage line 172 is wired in the x-axis and y-axis directions in a mesh structure to prevent voltage drops in the driving voltage (QVDD) in any of the regions of the display area.

The main driving voltage lines 172vl and 172vr may include portions with a triple-layer structure. The first main driving voltage lines 172-1vl and 172-1vr may be disposed on the first conductive layer, second main driving voltage lines 172-2*vl* and 172-2*vr* may be disposed on the second conductive layer, and third main driving voltage lines 172-3*vl* and 172-3*vr* may be disposed on the third conductive layer. The first main driving voltage lines 172-1*vl* and 172-1*vr* may be sequentially disposed in the x-axis direction, and the second main driving voltage lines 172-2*vl* and 172-2*vr* and the third main driving voltage lines 172-3*vl* and 172-3*vr* may extend in the x-axis direction in a predetermined region and may be electrically connected to the first main driving voltage lines 172-1*vl* and 172-1*vr* to reduce wire resistance. In the connection structure of the triple layers of the main driving voltage lines 172*vl* and 172*vr*, the first conductive layer may be connected to the third conductive layer and the third conductive layer may be connected to the second conductive layer, electrically connecting the three layers to each other similar to the connection structure of the connecting scan signal lines 151*vl* and 151*vr* of FIG. 5. The first main driving voltage lines 172-1*vl* and 172-1*vr* may be electrically connected to the third main driving voltage lines 172-3*vl* and 172-3*vr* through the opening in the first insulating layer 120, the second insulating layer 140, and the third insulating layer 160, and the third main driving voltage lines 172-3*vl* and 172-3*vr* are electrically connected to the second main driving voltage lines 172-2*vl* and 172-2*vr* through the opening in the third insulating layer 160. In the embodiment, the first main driving voltage lines 172-1*vl* and 172-1*vr* are not directly connected to the second main driving voltage lines 172-2*vl* and 172-2*vr*. However, the embodiments are not limited thereto, and the main driving voltage lines 172*vl* and 172*vr* may be electrically connected in a variety of ways, and they may have a double-layer or single-layer structure.

The sub-driving voltage lines 172*h*-1 and 172*h*-2 are disposed as a single layer on the third conductive layer.

The two main driving voltage lines 172*vl* and 172*vr* are electrically connected to the two sub-driving voltage lines 172*h*-1 and 172*h*-2. In an embodiment described with reference to FIG. 3, the main driving voltage line 172*vl* disposed on a left side of the pixel circuit is electrically connected to the sub-driving voltage line 172*h*-1 disposed at a top side of the pixel circuit, and the main driving voltage line 172*vr* disposed on a right of the pixel circuit is electrically connected to the sub-driving voltage line 172*h*-2 disposed at a bottom side of the pixel circuit. Regarding the connection relationship, the main driving voltage line 172*vl* and the sub-driving voltage line 172*h*-1 may be directly connected to the third conductive layer. The third main driving voltage line 172-3*vl* belonging to the main driving voltage line 172*vl* may extend in the y-axis direction to configure a sub-driving voltage line 172*h*-1. Also, the third main driving voltage line 172-3*vr* of the main driving voltage line 172*vr* may extend in the y-axis direction and may be integrally formed with the sub-driving voltage line 172*h*-2.

The main driving voltage line 172*vl* disposed on the left of the pixel circuit is electrically connected to the first semiconductors 131*a*, 131*b*, and 131*c* through the connecting member 172*c* disposed on the third conductive layer on the portion in which the first main driving voltage line 172-1*vl* disposed on the first conductive layer is disposed. The first main driving voltage line 172-1*vl* is electrically connected to the connecting member 172*c* through the opening, and the connecting member 172*c* is electrically connected to the first semiconductors 131*a*, 131*b*, and 131*c* through the opening, so the driving voltage (QVDD) is transmitted to the first semiconductors 131*a*, 131*b*, and 131*c*.

The initialization voltage line 173*v* for transmitting the initialization voltage (VINT) is disposed on the left of the pixel circuit, it extends in the x-axis direction, and may include a portion having a triple-layer structure. A first initialization voltage line 173-1*v* disposed on the first conductive layer, a second initialization voltage line 173-2*v* disposed on the second conductive layer, and a third initialization voltage line 173-3*v* disposed on the third conductive layer. The first initialization voltage line 173-1*v* may be continuously disposed in the x-axis direction, and the second initialization voltage line 173-2*v* and the third initialization voltage line 173-3*v* may extend in the x-axis direction in a region and may be electrically connected to the first initialization voltage line 173-1*v* to reduce wire resistance. In the connection structure of three layers of the initialization voltage line 173*v*, the first conductive layer may be connected to the third conductive layer and the third conductive layer may be connected to the second conductive layer, so the triple layers are electrically connected to each other similarly to the connecting scan signal lines 151*vl* and 151*vr* described with reference to FIG. 5. The first initialization voltage line 173-1*v* is electrically connected to the third initialization voltage line 173-3*v* through the opening in the first insulating layer 120, the second insulating layer 140, and the third insulating layer 160, and the third initialization voltage line 173-3*v* is electrically connected to the second initialization voltage line 173-2*v* through the opening in the third insulating layer 160. In the embodiment, the first initialization voltage line 173-1*v* is not directly connected to the second initialization voltage line 173-2*v*. However, the embodiments are not limited thereto and, the initialization voltage line 173*v* may be electrically connected in a variety of ways, and they may have a double-layer or single-layer structure.

The initialization voltage line 173*v* is electrically connected to the third semiconductors 133*a*, 133*b*, and 133*c* through the connecting member 173*c* disposed on the third conductive layer on the portion in which the first initialization voltage line 173-1*v* is disposed on the first conductive layer. The first initialization voltage line 173-1*v* may be electrically connected to the connecting member 173*c* through the opening, and the connecting member 173*c* may be electrically connected to the third semiconductors 133*a*, 133*b*, and 133*c* through the opening, so the initialization voltage (VINT) is transmitted to the third semiconductors 133*a*, 133*b*, and 133*c*.

The transistors T1, T2, and T3 may have the same stacking structure and include a gate electrode disposed on the second conductive layer, a channel disposed on the semiconductor layer, and a first region and a second region disposed on respective sides of the channel and doped to have a same/similar characteristic to a conductor. Here, the first region and the second region disposed on the semiconductor layer may correspond to the first electrode and the second electrode described with reference to FIG. 2.

The respective transistors will now be described in detail.

The driving transistor T1 includes a channel, a first region, and a second region on the first semiconductors 131*a*, 131*b*, and 131*c* disposed on the first insulating layer 120, and the first region and the second region are doped to have the same or similar conductive characteristic as/to the conductor. The first regions of the first semiconductors 131*a*, 131*b*, and 131*c* are electrically connected to the main driving voltage line 172*vl* through the opening and the connecting member 172*c* to receive a driving voltage (QVDD). The second regions of the first semiconductor 131*a*, 131*b*, and 131*c* are electrically connected to the upper storage electrodes 175*a*, 175*b*, and 175*c* disposed on the third conductive layer through the opening and are electrically connected to the lower storage electrodes 125*a*, 125*b*, and 125*c* and the third semiconductors 133*a*, 133*b*, and 133*c* through an additional opening disposed in the first conductive layer. The first semiconductors 131*a*, 131*b*, and 131*c* are covered by the second insulating layer 140, and gate electrodes 155*a*, 155*b*, and 155*c* are formed on the second insulating layer 140. In a plan view, a channel is formed on the first semiconductors 131*a*, 131*b*, and 131*c* overlapping the gate electrodes 155*a*, 155*b*, and 155*c*, and the channel is covered by the gate electrodes 155*a*, 155*b*, and 155*c* and is not doped. The gate electrodes 155*a*, 155*b*, and 155*c* are electrically connected to the second semiconductors 132*a*, 132*b*, and 132*c* through the opening and the connecting members 176*a*, 176*b*, and 176*c*. Here, the connecting members 176*a*, 176*b*, and 176*c* are disposed on the third conductive layer.

The input transistor T2 includes a channel, a first region, and a second region on the second semiconductors 132*a*, 132*b*, and 132*c* disposed on the first insulating layer 120, and the first region and the second region are doped to have the same or similar conductive characteristic as a conductor. The first regions of the second semiconductors 132*a*, 132*b*, and 132*c* are electrically connected to the data lines 171*a*, 171*b*, and 171*c* through the opening and the connecting members 177*a*, 177*b*, and 177*c* to receive data voltages (DVa, DVb, and DVc). The second regions of the second semiconductors 132*a*, 132*b*, and 132*c* are electrically connected to the gate electrodes 155*a*, 155*b*, and 155*c* through the opening and the connecting members 176*a*, 176*b*, and 176*c*. The connecting members 176*a*, 176*b*, and 176*c* extend toward the channels of the second semiconductor 132*a*, 132*b*, and 132*c* to cover the channels of the second semiconductors 132*a*, 132*b*, and 132*c*. The second semiconductors 132*a*, 132*b*, and 132*c* are covered by the second insulating layer 140, and a gate electrode 156 is formed on the second insulating layer 140. In a plan view, a channel is formed on the second semiconductors 132*a*, 132*b*, and 132*c* overlapping the gate electrode 156, and the channel is covered by the gate electrode 156 and is not doped. The gate electrode 156 extends to be electrically connected to the main scan signal line 151*h* through the opening.

The initialization transistor T3 includes a channel, a first region, and a second region on the third semiconductor 133*a* disposed on the first insulating layers 120, 133*b*, and 133*c*, and the first region and the second region are doped to have the same or similar conductive characteristic as/to the conductor. The first regions of the third semiconductors 133*a*, 133*b*, and 133*c* are electrically connected to the upper storage electrodes 175*a*, 175*b*, and 175*c* disposed on the third conductive layer through the opening, and are also electrically connected to the lower storage electrodes 125*a*, 125*b*, and 125*c* disposed on the first conductive layer and the first semiconductors 131*a*, 131*b*, and 131*c* disposed on the second conductive layer through an additional opening. The second regions of the third semiconductors 133*a*, 133*b*, and 133*c* are electrically connected to the initialization voltage line 173*v* through the opening and the connecting member 173*c* and receive the initialization voltage (VINT). The third semiconductors 133*a*, 133*b*, and 133*c* are covered by the second insulating layer 140, and a gate electrode 157 is formed on the second insulating layer 140. In a plan view, a channel is formed on the third semiconductors 133*a*, 133*b*, and 133*c* overlapping the gate electrode 157, and the channel is covered by the gate electrode 157 and is not doped. The gate electrode 157 extends to be electrically connected to the main scan signal line 151*h* through the opening.

The storage capacitor Cst includes a first storage capacitor Cst1 and a second storage capacitor Cst2 as shown in FIG. 4.

The first storage capacitor Cst1 includes gate electrodes 155*a*, 155*b*, and 155*c* disposed on the second conductive layer, a third insulating layer 160 disposed thereon, and upper storage electrodes 175*a*, 175*b*, and 175*c* disposed thereon. The second storage capacitor Cst2 includes lower storage electrodes 125*a*, 125*b*, and 125*c* disposed on the first conductive layer, a first insulating layer 120 and a second insulating layer 140 disposed thereon, and gate electrodes 155*a*, 155*b*, and 155*c* disposed thereon. As a result, the triple-layer structure having the storage electrodes (upper storage electrodes 175*a*, 175*b*, and 175*c*) and the lower storage electrodes 125*a*, 125*b*, and 125*c* from top to bottom overlapping each other in a plan view with the gate electrodes 155*a*, 155*b*, and 155*c* in common is provided.

The lower storage electrodes 125*a*, 125*b*, and 125*c* are electrically connected to the upper storage electrodes 175*a*, 175*b*, and 175*c* through the opening, and the gate electrodes 155*a*, 155*b*, and 155*c* are included in common into the first storage capacitor Cst1 and the second storage capacitor Cst2, so the first storage capacitor Cst1 and the second storage capacitor Cst2 have a structure coupled in parallel according to a circuit structure.

The upper storage electrodes 175*a* and 175*b* are integrally formed and may include anode connecting members 179*a* and 179*b* extending on one side. The anode connecting members 179*a* and 179*b* are electrically connected to anodes (not shown) of the light emitting diodes (EDa and EDb) through the openings 185*a* and 185*b* in the fourth insulating layer 180.

The upper storage electrode 175*c* does not include an extending anode connecting member, and it is electrically connected to an anode (not shown) of the light emitting diode (EDc) through the opening 185*c* disposed in an upper portion of the upper storage electrode 175*c*.

According to the structure according to an embodiment described with reference to FIG. 3, from among the group of light emitting diodes (EDa, EDb, and EDc), the first light emitting diode (EDa) is disposed on the left, the second light emitting diode (EDb) is disposed on the right, and the third light emitting diode (EDc) is disposed in the center.

The light emitting diodes (EDa, EDb, and EDc) include an anode (refer to 191 of FIG. 15), an emission layer (refer to 370 of FIG. 15), and a cathode (refer to 270 of FIG. 15), and the anode is disposed on the fourth insulating layer 180. A partition wall (refer to 370 of FIG. 15) may be given to separate the light emitting diodes (LED) from each other, and the partition wall may expose the anode, an emission layer may be made through the exposed portion, and a cathode may be disposed thereon.

The emission layer may be in the opening of the partition wall according to an embodiment, and the emission layer 370 is formed on the exposed anode 191 and the partition wall 350 according to an embodiment described with reference to FIG. 15. The cathode 270 is formed on the emission layer 370. According to an embodiment following FIG. 15, the emission layer 370 and the cathode 270 may be entirely disposed to use no mask.

An encapsulation layer, a color conversion layer, or a color filter may be included to the upper portion of the light emitting diodes (EDa, EDb, and EDc), which will be described in a latter portion of the specification with reference to FIG. 15.

The configuration of the pixel circuit disposed in the scan signal applied region (or the center region) has been described with reference to FIG. 3 to FIG. 5.

A configuration of a pixel circuit of a pixel disposed in a dummy region (or a side region) will now be described with reference to FIG. 6 to FIG. 8.

A configuration of a pixel circuit disposed on a left outermost side in the dummy region (or the side region) will now be described with reference to FIG. 6.

FIG. 6 shows a top plan view of a pixel disposed on an outermost left side of a light emitting display device according to an embodiment.

Compared to the configuration described with reference to FIG. 3, a first dummy wire 152 is provided, instead of the connecting scan signal line 151vl disposed on the left of the pixel circuit, in the pixel circuit disposed on the left outermost side of FIG. 6. The first dummy wire 152 is a single layer and is made of a first conductive layer. The first dummy wire 152 is narrower than the connecting scan signal line 151vl, and as a result, a gap between a left edge of the substrate of the light emitting display device 10 and the first dummy wire 152 is equal to or greater than about 50 μm. The width of the first dummy wire 152 is controlled so that it may have the gap between the left edge of the substrate and the first dummy wire 152 may be equal to or greater than about 50 μm. The width of the first dummy wire 152 may be equal to or greater than about 5 μm and equal to or less than about 10 μm, and the width of the connecting scan signal line 151vl may be about 15 μm. The width of the wire may vary according to embodiments.

An Off voltage Voff for maintaining transistors in a turn-off state from scan signals may be applied to the first dummy wire 152. The first dummy wire 152 is narrow, and may have a relatively large resistance. Thus the first dummy wire 152 may have a large voltage drop value, so voltage values that can cause errors when the lower voltage value of the first dummy wire 152 is used in the pixel circuit are no applied to the first dummy wire 152. Further, depending on embodiments, the first dummy wire 152 may float with no voltage being applied, or another voltage may be applied.

The gap between the left edge of the substrate and the first dummy wire 152 may be equal to or greater than about 50 μm by forming the first dummy wire 152 to be narrow, so sufficient tolerance or margins are provided in the process such as laser beam cutting when another light emitting display device 10 is attached to the left to form a large display device. As a result, when the large display device is completed, the gaps among the light emitting diodes (EDa, EDb, and EDc) may be kept constant, thereby improving displaying quality of the large display device.

In contrast to FIG. 3, according to an embodiment described with reference to FIG. 6, a second dummy wire 153r is disposed instead of the connecting scan signal line 151vr disposed on the right of the pixel circuit. The second dummy wire 153r is one side of the pixel circuit disposed on the left outermost side and is disposed on a side on which the first dummy wire 152 is not disposed. The second dummy wire 153r is provided as a single layer and is made of a first conductive layer. The second dummy wire 153r may have the same width as the connecting scan signal line 151vr. The widths of the second dummy wire 153r and the connecting scan signal line 151vr may be about 15 μm. The widths of the wires are variable according to embodiments.

A configuration of a pixel circuit not disposed on the outermost side in the dummy region (or the side region) will now be described with reference to FIG. 7.

FIG. 7 shows a schematic top plan view of a pixel disposed in a dummy region of a light emitting display device according to an embodiment.

Compared to the configuration shown in FIG. 3, the connecting scan signal lines 151vl and 151vr are not disposed on respective sides of the pixel circuit and the second dummy wires 153l and 153r are disposed instead in the pixel circuit shown in FIG. 7. The second dummy wires 153l and 153r are disposed to be a single layer and are made of a first conductive layer. The second dummy wires 153l and 153r may have the same width as the connecting scan signal lines 151vl and 151vr. For example, the widths of the second dummy wires 153l and 153r and the connecting scan signal lines 151vl and 151vr may be about 15 μm. The widths of the wires are variable according to embodiments.

An Off voltage Voff for maintaining the transistor in a turn-off state from among scan signals may be applied to the second dummy wires 153l and 153r. Depending on embodiments, no voltage may be applied to the second dummy wires 153l and 153r so they may float, or another voltage may be applied thereto.

A configuration of a pixel circuit disposed on the right outermost side in the dummy region (or the side region) will now be described with reference to FIG. 8.

FIG. 8 shows a top plan view of a pixel disposed on an outermost right side of a light emitting display device according to an embodiment.

Compared to the configuration described with reference to FIG. 3, a first dummy wire 152 is disposed, instead of the connecting scan signal line 151vr disposed on the right of the pixel circuit, in the pixel circuit disposed on the right outermost side of FIG. 8. Further, a second dummy wire 153l is disposed instead of the connecting scan signal line 151vl disposed on the left of the pixel circuit. The second dummy wire 153l is one side of the pixel circuit disposed on the right outermost side and is disposed on a side on which the first dummy wire 152 is not disposed.

The first dummy wire 152 is provided to be a single layer and is made of a first conductive layer. The first dummy wire 152 is narrower than the connecting scan signal line 151vr, and as a result, a gap between a right edge of the substrate of the light emitting display device 10 and the first dummy wire 152 is equal to or greater than about 50 μm. The width of the first dummy wire 152 is controlled so that it may have the gap between the right edge of the substrate and the first dummy wire 152 may be equal to or greater than about 50 μm. The width of the first dummy wire 152 may be equal to or greater than about 5 μm and equal to or less than about 10 μm, and the width of the connecting scan signal line 151vr may be about 15 m. The widths of the wires are variable according to embodiments.

An Off voltage Voff for maintaining the transistor in a turn-off state from among scan signals may be applied to the first dummy wire 152. The first dummy wire 152 is narrow, and resultantly has relatively large resistance, and has a large voltage drop value, so when the voltage value is reduced when the first dummy wire 152 is used to the pixel circuit, the voltage that may generate troubles may not be used. Depending on embodiments, no voltage may be applied to the first dummy wire 152 so they may float, or another voltage may be applied thereto.

The gap between the right edge of the substrate and the first dummy wire 152 may be equal to or greater than about 50 μm by forming the first dummy wire 152 to be narrow, so sufficient tolerance or margins are provided in the process such as laser beam cutting when another light emitting display device 10 is attached to the right of the light emitting display device 10 to form a large display device. As a result, when the large display device is completed, the gaps among the light emitting diodes (EDa, EDb, and EDc) may be kept constant, thereby improving displaying quality of the large display device.

The second dummy wire 1531 is a single layer and is made of a first conductive layer. The second dummy wire 1531 may have the same width as the connecting scan signal line 151v*l*. For example, the widths of the second dummy wire 1531 and the connecting scan signal line 151v1 may be about 15 μm. The widths of the wires are variable according to embodiments.

When the configuration of FIG. 6 and FIG. 8 is on the left outermost side and the right outermost side to attach other light emitting display devices 10 to the right and the left of the light emitting display device 10, the gap among the light emitting diodes (EDa, EDb, and EDc) may be kept constant.

Referring to FIG. 1, the width of the wire is not reduced on the lower side of the light emitting display device 10, and this is because the gap between the lower edge of the substrate and the pixel circuit is equal to or greater than about 50 μm. Therefore, another light emitting display device 10 may be attached to the lower side of the light emitting display device 10, and the gap among the light emitting diodes (EDa, EDb, and EDc) may be kept constant.

Referring to FIG. 1, a driving area is disposed on the upper side of the light emitting display device 10 and has a width that is equal to or greater than about 50 μm.

The light emitting display device 10 in which the driving area is disposed on the upper side has been described with reference to FIG. 1, and the driving area may be disposed on the lower side depending on embodiments. A light emitting display device in which a driving area is disposed on a lower side will now be described with reference to FIG. 9.

Figure 9:
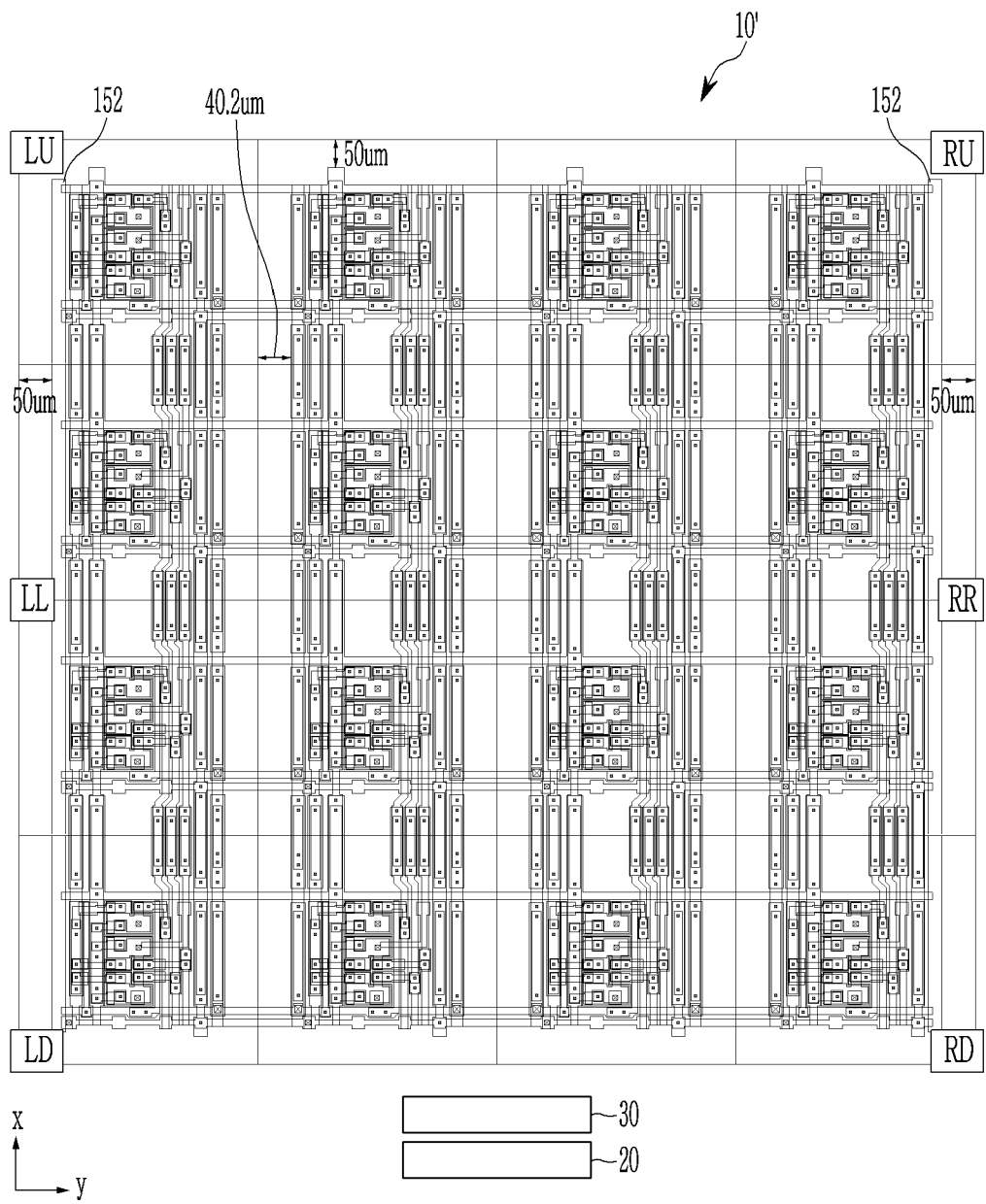
FIG. 9 shows a schematic diagram of a light emitting display device according to an embodiment.

FIG. 9 shows a schematic diagram of a light emitting display device according to an embodiment.

As shown in FIG. 9, regarding the light emitting display device 10', a driving area is disposed on the lower side, and a data driver 20 and a scan driver 30 may be disposed on the lower side and may be mounted on the substrate in a chip form.

FIG. 9 does not show a sub-region in the light emitting display device 10', and for ease of illustration, one data driver 20 and one scan driver 30 are illustrated and the sub-regions were omitted. However, depending on embodiments, the light emitting display devices 10 and 10' may each include a data driver 20 and a scan driver 30.

FIG. 9 shows positions of respective portions with letters in the light emitting display device 10'. L represents a left non-display area of the light emitting display device 10', and R indicates a right non-display area of the light emitting display device 10'. U represents an upper region, and D indicates a lower region. LU represents an upper region of the left non-display area, and RD represents a lower region of the right non-display area. LL indicates a center region on the left, and RR indicates a center region on the right. Here, the left non-display area represents the area to the left outermost pixel circuit from the left edge of the substrate, and the right non-display area represents the area to the right outermost pixel circuit from the right edge of the substrate.

FIG. 9 shows the widths of the non-display areas on the outside according to an embodiment. Regarding the light emitting display device 10' shown in FIG. 9, the outermost pixel circuits on respective sides have the gap of equal to or greater than about 50 μm from the substrate, and the gap between the pixel and the edge of the substrate is equal to or greater than about 50 μm on the upper side where the driving area is not disposed. Other light emitting display devices may be attached to the top, right, and left sides of the light emitting display device 10', and the gap among the light emitting diodes (EDa, EDb, and EDc) may be kept constant.

Referring to FIG. 9, a center line between neighboring pixel circuits that are on the right and the left is given as a solid line, and a gap to the center line from one pixel circuit is given as about 40.2 μm. Therefore, when a narrow first dummy wire 152 is not disposed as shown in FIG. 6 and FIG. 8, the gap to the right and left edges of the substrate becomes about 40.2 μm and may be less than about 50 μm that is required to provide a sufficient tolerance or margin for cutting and attaching other light emitting display devices. The gap between the light emitting diodes (EDa, EDb, and EDc) may become different and deteriorate quality of the displayed image when another light emitting display device is attached to the right or the left.

However, in the embodiment, a narrow first dummy wire 152 may be disposed, and the gap between the edge of the substrate and the pixel circuit may be controlled to be equal to or greater than about 50 μm which is required to provide a sufficient tolerance or margin, thereby displaying an accurate image when the large display device is manufactured.

The configuration of a large display device completed according to an embodiment will be described with reference to FIG. 10.

Figure 10:
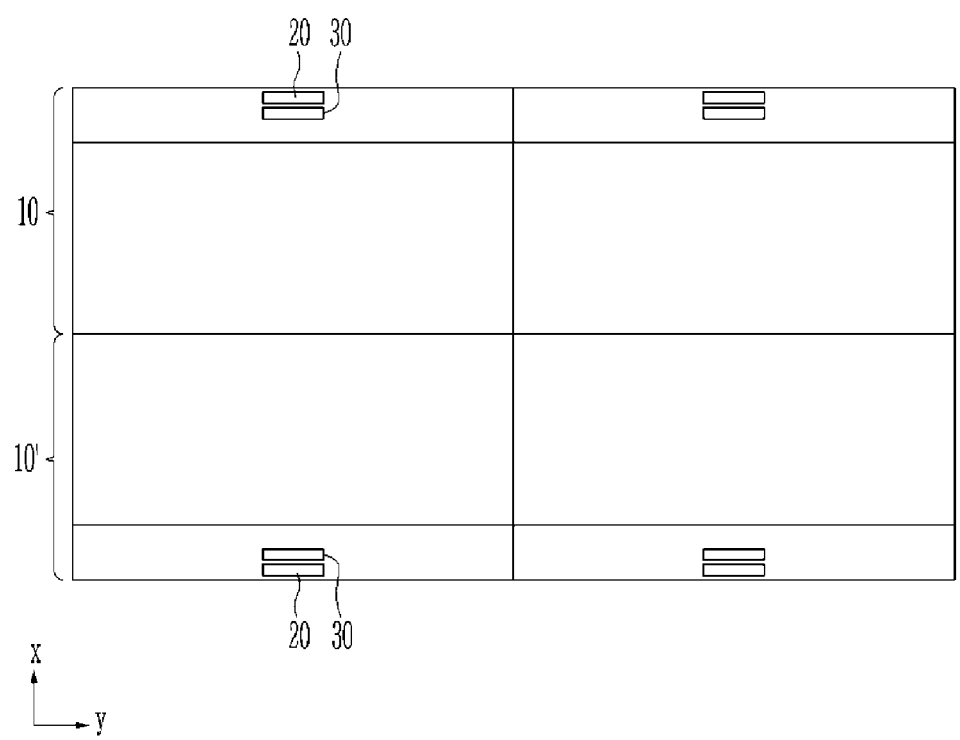
FIG. 10 shows a schematic diagram of a large display device according to an embodiment.

FIG. 10 shows a schematic diagram of a large display device according to an embodiment.

The large display device according to an embodiment shown in FIG. 10 may be manufactured by attaching four light emitting display devices 10 and 10'.

Regarding the respective light emitting display devices 10 and 10', the driving area and the display area are distinguished and illustrated by the solid lines, and as shown in FIG. 9, only one data driver 20 and one scan driver 30 are shown for each of the light emitting display devices, and no sub-regions are shown. Although FIG. 10 simplifies the illustration of the light emitting display devices 10 and 10', as shown in FIG. 1, the light emitting display devices 10 and 10' may include multiple sub-regions, data drivers 20, and scan drivers 30.

Referring to FIG. 10, lateral sides of the two light emitting display devices 10 where the driving area may be disposed on the upper side are attached to each other in the y-axis direction. Narrow first dummy wires 152 may be disposed on the attached lateral sides of the two light emitting display devices 10. Before the two light emitting display devices 10 are attached on their lateral sides, the gap between the first dummy wire 152 and the edge of the substrate may be equal to or greater than about 50 μm. After the two light emitting display devices 10 are attached on their lateral sides as shown in FIG. 10, the gap between the two first dummy wires 152 may be adjusted to be double the gap (about 40.2 μm) shown in FIG. 9. As a result, the gap between the pixel circuits or the light emitting diodes (EDa, EDb, and EDc) that are on the two different light emitting display devices 10 but are adjacent to each other after they are attached becomes identical to the gaps between other pixels in each of the light emitting display devices 10.

Regarding the two light emitting display devices 10' where the driving area may be disposed on the lower side, narrow first dummy wires 152 may be disposed on the lateral sides that are attached to each other in the y-axis direction. Regarding the two light emitting display devices 10' before the lateral sides may be attached, the gap between the first dummy wire 152 and the edge of the substrate is equal to or greater than about 50 μm. After the two light emitting display devices 10' are attached to each other as shown in FIG. 10, the gap between the two first dummy wires 152 may be adjusted to be double the gap (about 40.2 μm) shown in FIG. 9. As a result, the gap of the pixel circuits or the light emitting diodes (EDa, EDb, and EDc) that are on the two different light emitting display devices 10' but are adjacent to each other after they are attached becomes identical the gaps between other pixels in each of the light emitting display devices 10'.

Regarding the portion in which the light emitting display device 10 in which the driving area may be disposed on the upper side and the light emitting display device 10' in which the driving area is disposed on the lower side are attached to each other in the x-axis direction, an empty gap disposed on the edge portion of the substrate has a margin of equal to or greater than about 50 μm, so the gap of the pixel circuits or the light emitting diodes (EDa, EDb, and EDc) that are adjacent to each other when attached after a process such as laser beam cutting is identical to other portions.

A modified embodiment will now be described with reference to FIG. 11 and FIG. 12.

An embodiment in which a configuration of a driving voltage line 172 for transmitting a driving voltage (QVDD) is modified will now be described with reference to FIG. 11.

Figure 11:
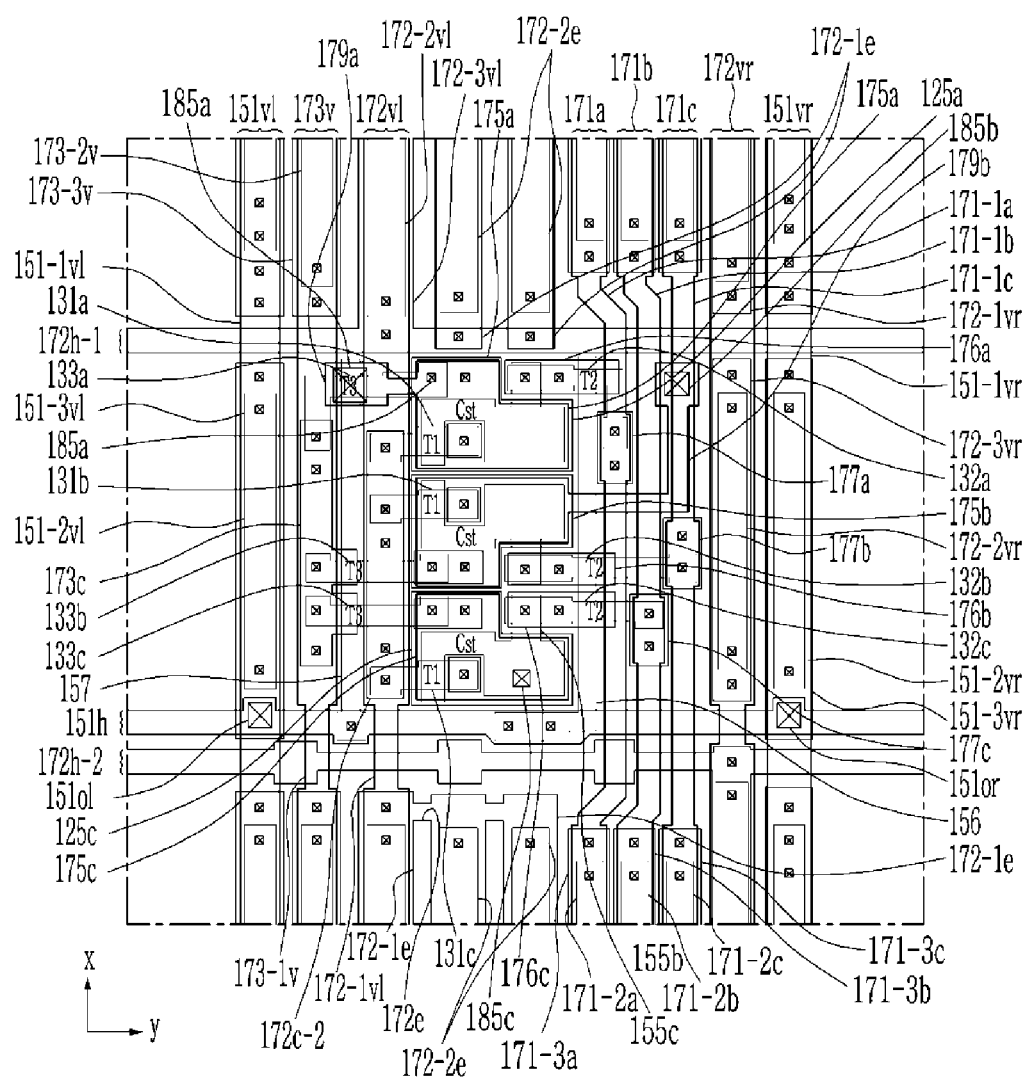
FIG. 11 shows a schematic top plan view of a pixel disposed in a scan signal applied region of a light emitting display device according to an embodiment.

FIG. 11 shows a top plan view of a pixel disposed in a scan signal applied region of a light emitting display device according to an embodiment.

In an embodiment described with reference to FIG. 11, differing from an embodiment described with reference to FIG. 3, additional wires (a driving voltage line extension 172e and additional driving voltage lines 172-1e and 172-2e) may be included for reducing resistance of the driving voltage line 172.

A configuration of the driving voltage line 172 differing from FIG. 3 will now be described in further detail.

From among the main driving voltage line 172vl disposed on the left of the pixel circuit, a first main driving voltage line 172-1vl disposed on the first conductive layer further includes a driving voltage line extension 172e protruding to the right in the y-axis direction below the main scan signal line 151h and the sub-driving voltage line 172h-2.

The driving voltage line extension 172e further includes a first additional driving voltage line 172-1e protruding from the first main driving voltage line 172-1vl in the y-axis direction and extending downward. A second additional driving voltage line 172-2e disposed on the second conductive layer is disposed on the two first additional driving voltage lines 172-1e of the driving voltage line extension 172e.

The first additional driving voltage line 172-1e and the second additional driving voltage line 172-2e overlap each other and are electrically connected to each other through an opening in a plan view. However, depending on embodiments, it may further include a third additional driving voltage line disposed on the third conductive layer, and it may connect three layers as shown in FIG. 5.

The first additional driving voltage line 172-1e extends in the x-axis direction and may be connected to the sub-driving voltage line 172h-1 disposed on the third conductive layer through an opening.

As described above, in an embodiment as illustrated in FIG. 11, including the driving voltage line extension 172e and the additional driving voltage lines 172-1e and 172-2e reduces resistance in the wire applying the driving voltage (QVDD) without increasing area of the pixel circuit as the additional components (the driving voltage line extension 172e and the additional driving voltage lines 172-1e and 172-2e) are disposed in the space of the pixel circuit that is not used in the embodiment of FIG. 3.

In other embodiments, additional voltage wires may further wire resistance, while adding components.

Figure 12:
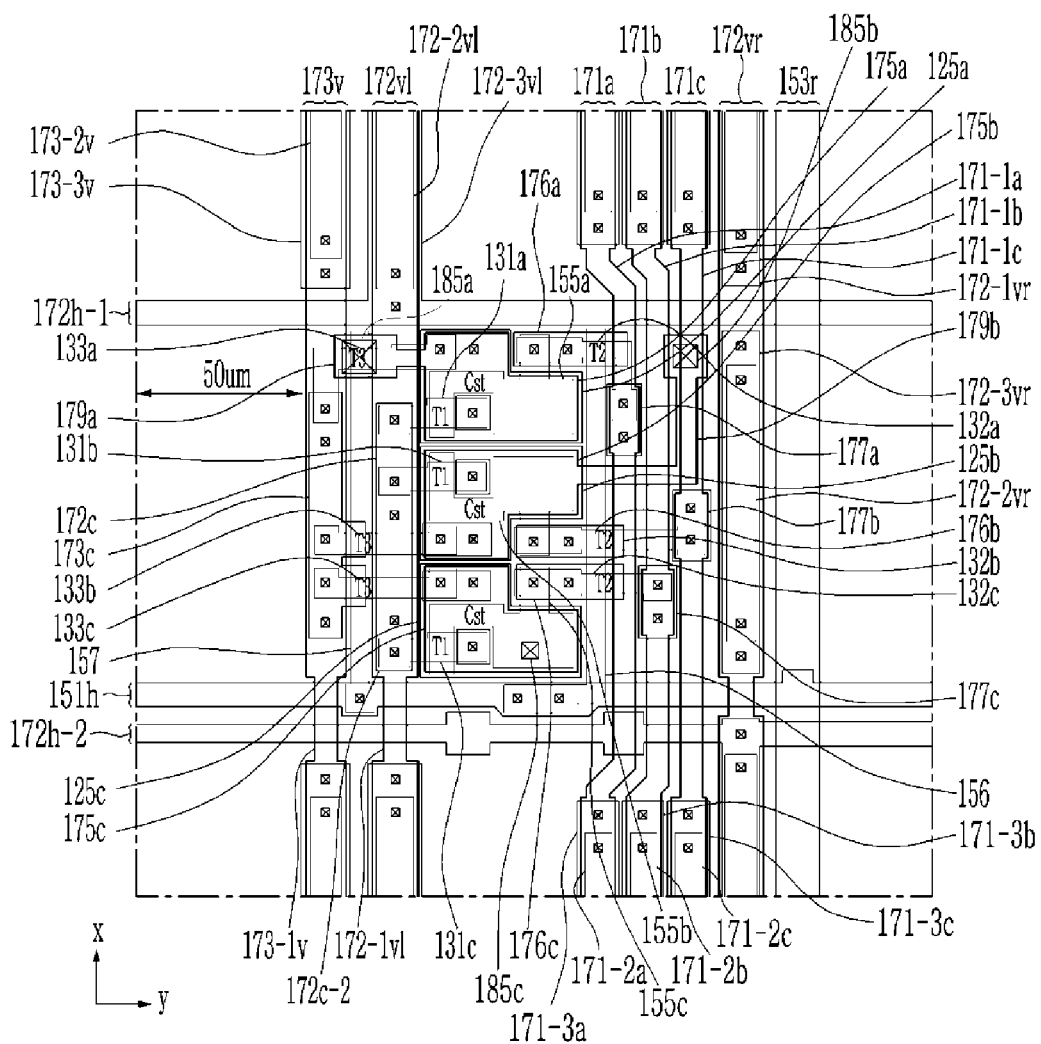
FIG. 12 shows a schematic top plan view of a pixel disposed on an outermost left side of a light emitting display device according to an embodiment.

FIG. 12 illustrates an embodiment where the gap between the edge of the substrate and the pixel circuit may be less than the margin of about 50 μm and where the width of the first dummy wire 152 is reduced.

FIG. 12 shows a schematic top plan view of a pixel disposed on an outermost left side of a light emitting display device according to an embodiment.

FIG. 12 illustrates an outermost pixel circuit, illustrating an embodiment in which the first dummy wire 152 may not be disposed, in contrast to the embodiment described in FIG. 6.

The outermost pixel circuit in FIG. 12 has differences with the pixel circuit disposed in the scan signal applied region (the center region) as shown in FIG. 3.

Referring to FIG. 3, a pair of connecting scan signal lines (151v; first scan signal lines) may be disposed on respective sides of the pixel circuit in the scan signal applied region (the center region). However, in FIG. 12, a second dummy wire 153 may be disposed where a connecting scan signal line (151v; a first scan signal line) may be disposed to left side of the outermost pixel circuit. In the outermost pixel circuit on the left, no wires may be disposed where a connecting scan signal line (151v; a first scan signal line) is to be disposed on the outside. Referring to FIG. 12, the wire on the left most of the outermost pixel circuit may not be the first dummy wire 152 but rather may be the initialization voltage line 173. Referring to FIG. 1, there are many dummy wires 152 and 153, and a same voltage (e.g., an Off voltage (Voff)) is applied to the dummy wires 152 and 153, so there are no problems when dummy wires may be 152 removed.

Further, in an embodiment described with reference to FIG. 12, the gap between the edge of the substrate and the pixel circuit may be equal to or greater than the margin of about 50 μm, so the gap may be adjusted, and the image may be accurately displayed when the large display device is manufactured.

Depending on embodiments, the first dummy wire 152 may be removed from the outermost pixel on the right. In an embodiment in which the first dummy wire 152 is not formed on the outermost pixel to the right, the wire disposed on the rightmost side of the outermost pixel circuit may be the main driving voltage line 172vr disposed on the right.

An embodiment having a circuit configuration that is different from what is described with reference to FIG. 2 will now be described with reference to FIG. 13 and FIG. 14.

Figure 13:
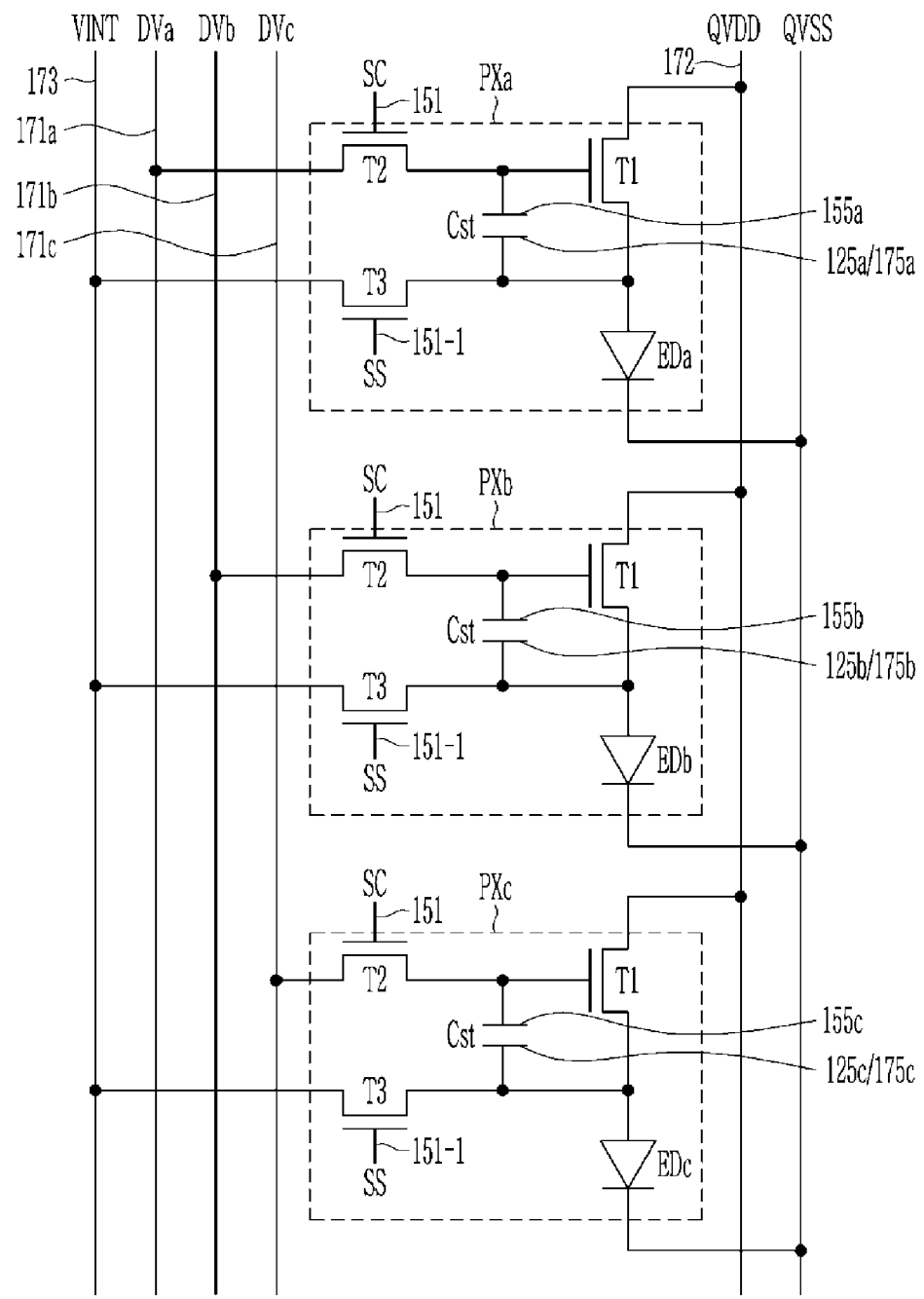
FIG. 13 shows a schematic diagram of an equivalent circuit of a pixel of a light emitting display device according to an embodiment.

FIG. 13 shows a circuit diagram of a pixel of a light emitting display device according to an embodiment.

Compared to FIG. 2, FIG. 13 shows an embodiment in which the gate electrode of the initialization transistor T3 receives a scan signal that is different from the gate electrode of the input transistor T2.

Differences of FIG. 13 from FIG. 2 will be described below.

In each of the pixels (PXa, PXb, and PXc), the gate electrode of the initialization transistor T3 may be connected to the second scan line 151-1 for transmitting a second scan signal (SS). The first electrode of the initialization transistor T3 maybe electrically connected to the second end of the storage capacitor Cst, the second electrode of the driving transistor T1, and the anodes of the light emitting diodes (EDa, EDb, and EDc), and the second electrode of the initialization transistor T3 may be electrically connected to the initialization voltage line 173 for transmitting an initialization voltage (VINT). The initialization transistor T3 is turned on by the second scan signal (SS) to transmit the initialization voltage (VINT) to the anodes of the light emitting diodes (EDa, EDb, and EDc) and the second end of the storage capacitor Cst and thereby initialize the voltage at the anodes of the light emitting diodes (EDa, EDb, and EDc). Further, depending on embodiments, the voltages at the anodes of the light emitting diodes (EDa, EDb, and EDc) are sensed to determine whether a target voltage of a previous frame is maintained before the initialization voltage (VINT) is transmitted to the anodes of the light emitting diodes (EDa, EDb, and EDc).

In an embodiment described in FIG. 13, sections for turning on the initialization transistor T3 and the input transistor T2 may be distinguished, so a programming operation performed by the input transistor T2, and an initialization operation performed by the initialization transistor T3 may be performed at different times.

Figure 14:
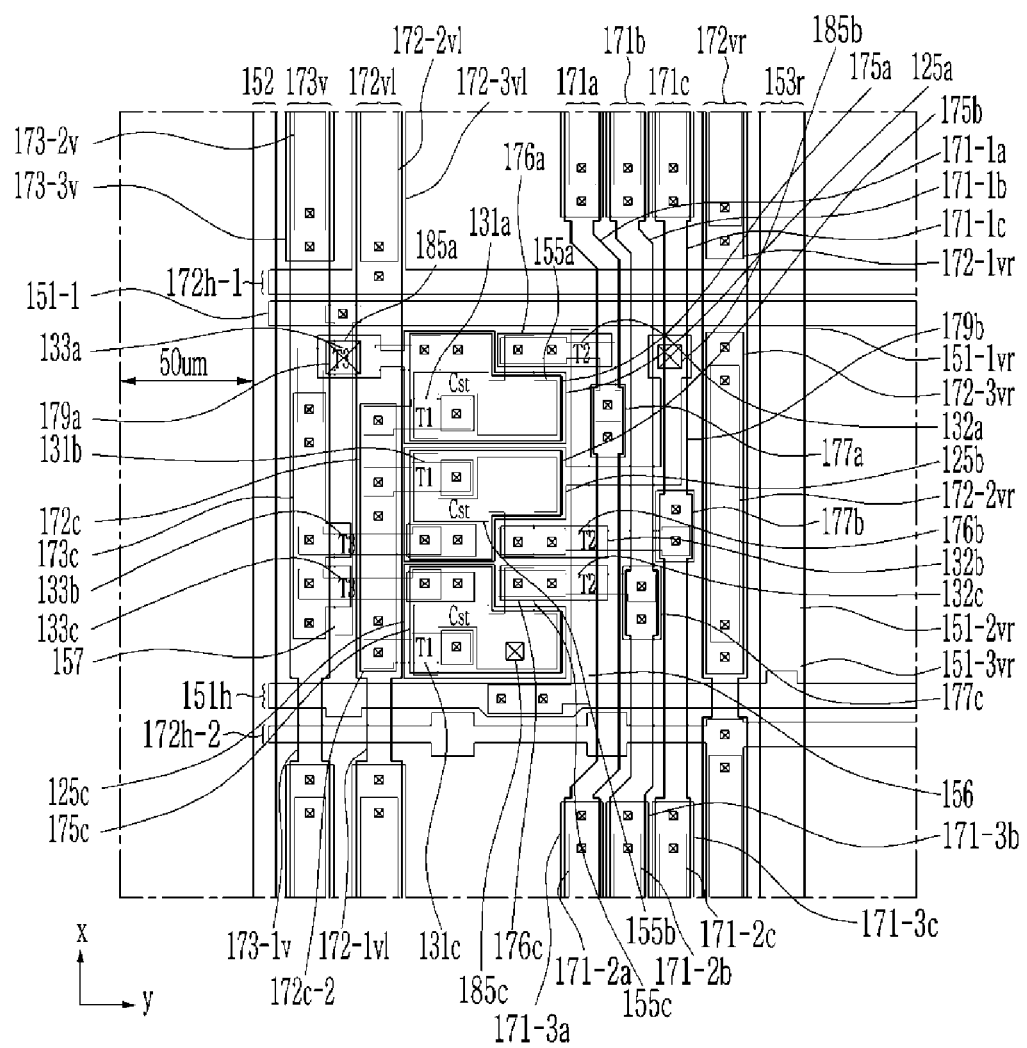
FIG. 14 shows a schematic top plan view of part of a light emitting display device according to an embodiment.

A configuration of a pixel circuit of a light emitting display device with the same circuit configuration as FIG. 13 is illustrated in FIG. 14.

FIG. 14 shows a schematic top plan view of part of a light emitting display device according to another embodiment.

FIG. 14 shows a pixel circuit having a first dummy wire 152 on the left corresponding to FIG. 6.

Differences of the configuration of the pixel circuit of FIG. 14 from FIG. 6 will now be described.

Differing from FIG. 6, FIG. 14 further shows a second scan line 151-1 disposed on the third conductive layer. The second scan line 151-1 extends in the y-axis direction and is electrically connected to the gate electrode 157 of the initialization transistor T3 through an opening.

The two scan lines 151 and 151-1 are separated from each other, so they may transmit scan signals with different timings and may independently control turn-on times of the input transistor T2 and the initialization transistor T3.

Regarding the light emitting display device, a light emitting diode (LED) including an anode, an emission layer, and a cathode may be formed on the fourth insulating layer, and an encapsulation layer, a color conversion layer, or a color filter may be additionally disposed on the light emitting diode (LED). A detailed cross-sectional configuration of an entire light emitting display device will now be described with reference to FIG. 15.

Figure 15:
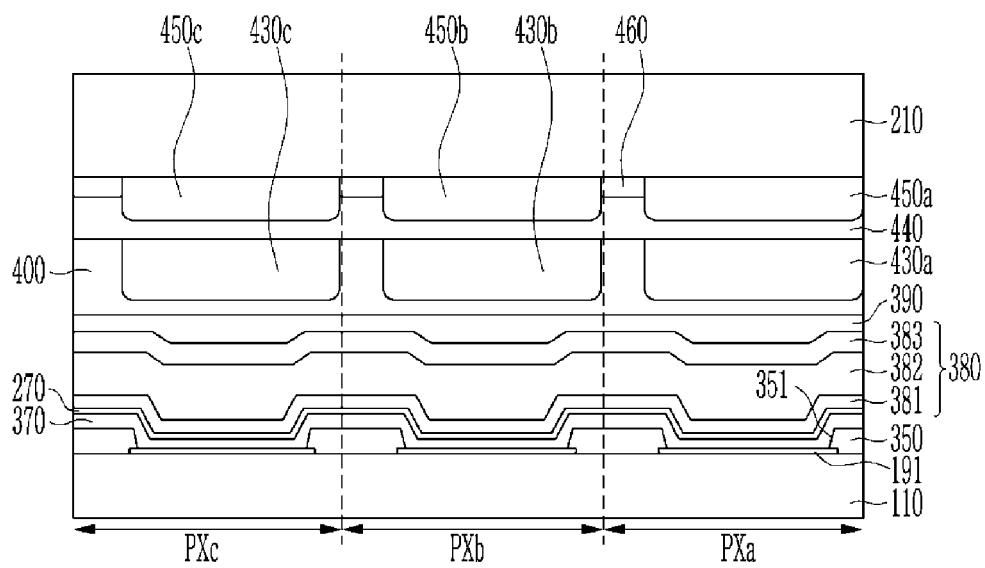
FIG. 15 shows a schematic cross-sectional view of a light emitting display device according to an embodiment.

FIG. 15 shows a cross-sectional view of a light emitting display device according to an embodiment.

FIG. 15 has omitted the pixel circuit from the configuration of the light emitting display device according to an embodiment and illustrates anodes 191 configuring the light emitting diodes (EDa, EDb, and EDc).

As shown in FIG. 15, anodes 191 are on the substrate 110 for the respective pixels (PXa, PXb, and PXc). The configuration of the pixel circuit, such as the transistors and insulating layers disposed between the substrate 110 and the anode 191 is omitted. Such components are illustrated in FIG. 3 to FIG. 5.

A partition wall 350 may be formed on the anode 191, and may include an opening 351 exposing part of the anode 191.

An emission layer 370 may be formed on the anode 191 and the partition wall 350, and the emission layer 370 is disposed in the entire region according to the embodiment. The emission layer 370 may emit first color light that may be blue light. Depending on embodiments, the emission layer 370 may be separately formed with respect to the opening 351 of the respective pixels, and the emission layers of the respective pixels may emit light of different colors. A cathode 270 may be formed on the entire emission layer 370.

An encapsulation layer 380 including insulating layers 381, 382, and 383 may be disposed on the cathode 270. The insulating layer 381 and the insulating layer 383 may include inorganic insulating materials, and an insulating layer 382 between the insulating layer 381 and the insulating layer 383 may include an organic insulating material.

A filling layer 390 including filler may be disposed on the encapsulation layer 380. A capping layer 400 including an insulating material, and color conversion layers 430a, and 430b and a transmission layer 430c, may be disposed on the filling layer 390.

The transmission layer 430c may transmit incident light. The transmission layer 430c may transmit first color light that may be blue light. The transmission layer 430c may include a polymer material for transmitting the first color light. A region in which the transmission layer 430c is disposed may correspond to a light emitting region for emitting blue light, and the transmission layer 430c may not include a semiconductor nanocrystal and may transmit the incident first color light.

The color conversion layers 430a and 430b may include different types of semiconductor nanocrystals. For example, the first color light input to the color conversion layer 430a may be converted into second color light and may then be discharged by the semiconductor nanocrystal included by the color conversion layer 430b. The first color light input to the color conversion layer 430b may be converted into third color light and may then be discharged by the semiconductor nanocrystal included by the color conversion layer 430b.

The semiconductor nanocrystal may include at least one of a fluorescent substance for converting the incident first color light into a second color light or a third color light, and a quantum dot material.

The core of the quantum dot may be selected from among a group II-VI compound, a group III-V compound, a group IV-VI compound, a group IV element, a group IV compound, or a combination.

The group II-VI compound may be selected from a binary compound including CdSe, CdTe, ZnS, ZnSe, ZnTe, ZnO, HgS, HgSe, HgTe, MgSe, MgS, or a mixture thereof, a tertiary compound selected from AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, or a mixture thereof, or a quaternary compound selected from among HgZnTeS, CdZnSeS, CdZnSeTe, CdZnSTe, CdHgSeS, CdHgSeTe, CdHgSTe, HgZnSeS, HgZnSeTe, HgZnSTe, or a mixture thereof.

The group III-V compound may be selected from a binary compound including GaN, GaP, GaAs, GaSb, AlN, AlP, AlAs, AlSb, InN, InP, InAs, InSb, or a mixture thereof, a tertiary compound selected from GaNP, GaNAs, GaNSb, GaPAs, GaPSb, AlNP, AlNAs, AlNSb, AlPAs, AlPSb, InGaP, InNP, InNAs, InNSb, InPAs, InPSb, GaAlNP, or a mixture thereof, and a quaternary compound selected from GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or a mixture thereof.

The group IV-VI compound may be selected from a binary compound including SnS, SnSe, SnTe, PbS, PbSe, PbTe, and a mixture thereof, a tertiary compound selected from SnSeS, SnSeTe, SnSTe, PbSeS, PbSeTe, PbSTe, SnPbS, SnPbSe, SnPbTe, or a mixture thereof, and a quaternary compound selected from among SnPbSSe, SnPbSeTe, SnPbSTe, or a mixture thereof. The group IV element may be selected from Si, Ge, and a mixture thereof. The group IV compound may be a binary compound selected from SiC, SiGe, or a mixture thereof.

The binary compound, the tertiary compound, or the quaternary compound may exist in the particles with uniform concentration or may exist in the same particle with a concentration distribution partially divided into some states. The color conversion media layer may have a core/shell structure where one quantum dot surrounds another quantum dot. An interface between the core and the shell may have a concentration gradient such that a concentration of an element existing in the shell is gradually reduced nearing the center of the quantum dot.

In some embodiments, the quantum dot may have a core-shell structure including a core including a nanocrystal as described above, and a shell surrounding the core. The shell of the quantum dot may function as a protective layer for maintaining the semiconductor characteristic by preventing chemical denaturation of the core and/or a charging layer for providing an electrophoretic characteristic to the quantum dot. The shell may be a single layer or may include multiple layers. An interface between the core and the shell may have a concentration gradient such that a concentration of an element existing in the shell is gradually reduced nearing the center. Examples of the shell of the quantum dot include a metallic or non-metallic oxide, a semiconductor compound, or a combination thereof.

For example, the metallic or non-metallic oxide may include binary compounds such as $SiO2$, $Al_2O_3$, $TiO2$, $ZnO$, $MnO$, $Mn2O3$, $Mn3O4$, $CuO$, $FeO$, $Fe_2O_3$, $Fe_3O_4$, $CoO$, $Co3O4$, or $NiO$, or tertiary compounds such as $MgAl2O4$, $CoFe2O4$, $NiFe2O4$, or $CoMn2O4$, and the embodiments are not limited thereto.

The semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, and AlSb, and the embodiments are not limited thereto.

The quantum dot may have a full width at half maximum (FWHM) of a light-emitting wavelength spectrum that is less than about 45 nm, for example, less than about 40 nm, or less than about 30 nm, and it may improve color purity or color reproducibility within this range. Further, light emitted through the quantum dot is output in all directions, thereby improving a light viewing angle.

The embodiments are not limited by the form of the quantum dot and may be formed to be spherical, pyramidal, multi-armed, or cubic nanoparticles, nanotubes, nanowires, nanofibers, and nanoplate-shaped particles.

The quantum dot may control the output color of light according to the size of particles, and hence, the quantum dot may have various light-emitting colors such as blue, red, and green.

An insulating layer 440 may be disposed on the color conversion layers 430a and 430b and a transmission layer 430c, and the color filters 450a, 450b, and 450c and a light blocking member 460 may be disposed on these components.

The color filter 450a may output second color light, the color filter 450b may express third color light, and the color filter 450c may express first color light.

The light blocking member 460 may be disposed between the neighboring color filters 450a, 450b, and 450c.

A substrate 210 may be formed on the color filters 450a, 450b, and 450c and a light blocking member 460. The color conversion layers 430a and 430b and color filters 450a, 450b, and 450c may be disposed between the substrate 110 and the substrate 210.

According to another embodiment, the emission layer 370 may include a quantum dot instead of the color conversion layers 430a and 430b and a transmission layer 430c.

The substrates 110 and 210 may include a same material. The encapsulation layer 380 may be disposed on the substrate 110, and the color filters 450a, 450b, and 450c, the light blocking member 460, the insulating layer 440, the color conversion layers 430a and 430b, the transmission layer 430c, and the capping layer 400 may be formed on the substrate 210. The substrate structures at the upper side and the lower side may be attached by using a filling layer 390. The substrate structures at the upper side and the lower side may be attached by further including a sealant inside or outside the filling layer 390.

Embodiments have been disclosed herein, and although terms are employed, they are used and are to be interpreted in a generic and descriptive sense only and not for purpose of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure as set forth in the following claims.

What is claimed is:

1. A display device comprising:
   a first pixel circuit;
   a first scan signal line disposed at a side of the first pixel circuit, extending in a first direction, and transmitting a scan signal;
   a second pixel circuit disposed at an outermost side of the display device; and
   a first dummy wire disposed at an outside of the second pixel circuit and extending in the first direction, wherein a width of the first dummy wire is less than a width of the first scan signal line.

2. The display device of claim 1, further comprising:
   a plurality of sub-regions, each of the plurality of sub-regions including:
      a scan signal applied region for transmitting the scan signal in the first direction; and
      a dummy region in which dummy wires are disposed, the dummy wires including the first dummy wire.

3. The display device of claim 2, wherein a voltage signal for turning off a transistor is applied to the dummy wires.

4. The display device of claim 2, wherein
   the dummy wires further include a second dummy wire, and
   a width of the second dummy wire is greater than the width of the first dummy wire.

5. The display device of claim 4, wherein the second dummy wire is disposed at a side of the second pixel circuit where the first dummy wire is not disposed.

6. The display device of claim 4, further comprising:
   a third pixel circuit disposed between the first pixel circuit and the second pixel circuit, wherein the second dummy wire is disposed at a side of the third pixel circuit.

7. The display device of claim 2, further comprising:
   a second scan signal line extending in a direction perpendicular to the first direction and transmitting the scan signal, wherein the second scan signal line is electrically connected to the first scan signal line.

8. The display device of claim 7, wherein
the plurality of sub-regions are provided as three sub-regions,
each of the three sub-regions includes the first scan signal line,
the second scan signal line extends in the three sub-regions,
the second scan signal line is electrically connected to the first scan signal line in each of the three sub-regions, and
the first scan signal line transmits a scan signal with a same timing.

9. The display device of claim 7, wherein the second scan signal line is electrically connected to a gate electrode of a thin film transistor included in the first pixel circuit and to a gate electrode of a thin film transistor included in the second pixel circuit.

10. The display device of claim 9, wherein the first pixel circuit and the second pixel circuit each include:
a driving transistor that generates an output current to a light emitting diode;
an input transistor that transmits a data voltage to a gate electrode of the driving transistor;
a storage capacitor having a terminal connected to the gate electrode of the driving transistor; and
an initialization transistor that initializes a terminal outputting the output current from the driving transistor.

11. A display device comprising:
a plurality of display panels attached to each other, wherein
at least one of the plurality of display panels includes:
a first pixel circuit;
a first scan signal line disposed at a side of the first pixel circuit and extending in a first direction;
a second pixel circuit disposed at an outermost side of the at least one display panel; and
an outermost dummy wire disposed at an outside of the second pixel circuit and extending in the first direction, and
a width of the outermost dummy wire is less than a width of the first scan signal line.

12. The display device of claim 11, wherein
the at least one display panel includes sub-regions, and each of the sub-regions includes:
a scan signal applied region for transmitting a scan signal in the first direction, and
a dummy region in which dummy wires are disposed, the dummy wires including the outermost dummy wire.

13. The display device of claim 12, wherein a voltage signal for turning off a transistor is applied to the dummy wires.

14. The display device of claim 12, wherein
the dummy wires further include a second dummy wire, and
a width of the second dummy wire is greater than a width of the first dummy wire.

15. The display device of claim 14, wherein the second dummy wire is disposed at a side of the second pixel circuit where the first dummy wire is not disposed.

16. The display device of claim 14, further comprising:
a third pixel circuit disposed between the first pixel circuit and the second pixel circuit, wherein the second dummy wire is disposed at a side of the third pixel circuit.

17. The display device of claim 12, further comprising:
a second scan signal line extending in a direction perpendicular to the first direction and transmitting the scan signal, wherein the second scan signal line is electrically connected to the first scan signal line.

18. The display device of claim 17, wherein
the sub-regions are provided as three sub-regions,
each of the three sub-regions includes the first scan signal line,
the second scan signal line extends in the three sub-regions,
the second scan signal line is electrically connected to the first scan signal line in each of the three sub-regions, and
the first scan signal line transmits a scan signal with a same timing.

19. The display device of claim 17, wherein the second scan signal line is electrically connected to a gate electrode of a thin film transistor included in the first pixel circuit and to a gate electrode of a thin film transistor included in the second pixel circuit.

20. A display device comprising:
a first pixel circuit;
a pair of first scan signal lines disposed at opposite sides of the first pixel circuit, respectively, extending in a first direction, transmitting a scan signal, and connected to the first pixel circuit;
a second pixel circuit disposed at an outermost side of the display device; and
a dummy wire disposed at a position corresponding to one of the pair of first scan signal lines inside the second pixel circuit,
wherein no dummy wire is disposed at a position corresponding to another one of the pair of first scan signal lines outside the second pixel circuit.

* * * * *